(12) United States Patent
Potter et al.

(10) Patent No.: US 6,324,239 B1
(45) Date of Patent: Nov. 27, 2001

(54) METHOD AND APPARATUS FOR A 1 OF 4 SHIFTER

(75) Inventors: Terence M. Potter; James S. Blomgren; Anthony M. Petro, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/206,539

(22) Filed: Dec. 7, 1998

Related U.S. Application Data

(60) Provisional application No. 60/069,250, filed on Dec. 11, 1997.

(51) Int. Cl.$^7$ .................................................. G11C 19/00
(52) U.S. Cl. .................................. 377/64; 377/70; 377/75
(58) Field of Search .................................. 377/64, 70, 75

(56) References Cited

U.S. PATENT DOCUMENTS

| | | |
|---|---|---|
| 5,208,489 | 5/1993 | Houston . |
| 5,208,490 | 5/1993 | Yeher . |
| 5,424,734 | 6/1995 | Hirahara et al. . |
| 5,524,088 | 6/1996 | Yoshida . |
| 5,633,905 * | 5/1997 | Brown .................................. 377/80 |
| 5,640,108 | 6/1997 | Miller . |
| 5,668,525 | 9/1997 | Chiu et al. . |

\* cited by examiner

*Primary Examiner*—Margaret R. Wambach
(74) *Attorney, Agent, or Firm*—Booth & Wright, L.L.P.; Matthew J. Booth

(57) ABSTRACT

The present invention comprises a multi-function shifter that uses N-nary logic and includes an operation selection and various 1-of-N multiplexers to support a variety of shift modes. The shift modes include rotates, logical shifts in which 0 is shifted into any vacated bit positions, and arithmetic shifts in which the value of the original most significant bit is shifted into any vacated bit positions. The present invention includes a general 32-bit shifter that can shift an arbitrary number of places in a single cycle, using any of the modes described above.

12 Claims, 12 Drawing Sheets

US 6,324,239 B1

METHOD AND APPARATUS FOR A 1 OF 4 SHIFTER

This application claims the benefits of the earlier filed U.S. Provisional Application Serial No. 60/069,250, filed Dec. 11, 1997, which is incorporated by reference for all purposes into this application.

BACKGROUND OF THE INVENTION

1. Field of the Invention

The present invention relates to digital logic circuits, and more specifically to bit mapping within a digital logic circuit.

2. Description of the Related Art

In a low-level computer architecture's bitwise manipulation of data, some means of translating binary data left or right by a variable number of positions has often proved useful. For example, such translation, or shifting, of a binary value having a single 1 has been used to examine each bit in a data word. The value is shifted one bit position each clock cycle and then AND-ed with a test value, and used to examine each bit in the test value, one bit at a time. Shifting can also be used to perform simple multiplication (shift left) and division (shift right) by powers of two, albeit with a loss of precision if any 1s are shifted out of the data.

Shifters have traditionally been constructed as standalone functional units. Some trivial shifters provide for shifting left and right by only one position, relying on the programmer to synthesize shifts through repeated application of the shift primitives. A more general shifter increases performance through being able to shift an arbitrary number of places in a fixed amount of time.

To accomplish the more general shifting by an arbitrary number of places, shifters have typically been constructed from an array of multiplexers. The number of multiplexers has generally been equal to the length of the received data value, while the number of bits of the received data value has been equal to the maximum shift amount. The multiplexers have been fabricated of an array of CMOS logic gates provided with the select values. The select value has generally been a binary number between zero and the length of the string of consecutive bits, and therefore can be used to select one of the bits from the string. The received data value has been partitioned into substrings, each beginning with a different bit of the received data value, yet each having a number of bits equal to one more than the maximum shift amount. The substrings have contained a portion of the received data value. Substrings beginning near the end of received data value have been completed by using bits near the beginning of the received data value.

Each of the multiplexers has been provided with the same shift amount value, which has been used to select one bit to each multiplexer. Consequently each multiplexer has provided a distinct bit of an output data value.

While the shifter of the prior art has proven useful in simple static binary CMOS shifting, several assumptions have been "built in" to the prior art shifter that inhibit its usefulness to other logic styles. Specifically, the received data value has been implemented in wires each representing a bit, and the shift amount has represented a number of bits. In other words, both the received data value and the shift amount have a "granularity" measured in bits. Shifters have generally been designed with such an assumption, that the "granularity" of the shift amount and the "granularity" of the received data value have been presumed to be equal.

Moreover, the granularity of all data values has been presumed to be one bit. Each physical wire implementing any data value has corresponded to one bit of the value. Implementing data values as binary strings of bits, and assigning one physical wire to each bit, has imposed a doctrinaire logic style of one-bit granularity.

One notable exception to the above is dual-rail logic. Dual-rail logic has implemented each bit of a data value on a pair of physical wires, one wire is for the "True" of the signal and the other wire is for the "False" of the signal. However, the granularity of data values remains one-bit, even in dual-rail logic.

SUMMARY OF THE INVENTION

The present invention comprises a method and apparatus for a 1 of 4 shifter that uses N-NARY logic. The shifter comprises an input configured to receive an input numerical value represented as a first plurality of N-nary signals where each of the N-nary signals is implemented on a set of physical wires. Additionally, the shifter comprises an output configured to provide an output numerical value represented as a second plurality of N-nary signals where each of the N-nary signals is implemented on a set of physical wires. And, the shifter includes a circuit configured to receive the input and to provide the output upon receiving the input with the output having a relationship with respect to the input defined by a shift operation. One embodiment of the present invention provides that there is no one-to-one correspondence between the wires of the input and the wires of the output.

Additionally, the present invention comprises a shifter that includes a shift amount input that receives a shift amount and that determines the relationship of the output with respect to the input. The shift amount input of the present invention provides for a value unequal to any integer multiple of the number log2 N where N represents the number of physical wires implementing each of the input N-nary signals. Additionally, the shift amount input provides for a value less than any integer multiple of the number log2 N, where N represents the number of physical wires implementing each of the input N-nary signals.

The shifter of the present invention is a multi-function shifter that includes an operation selection and various 1-of-N multiplexers to support a variety of shift modes. The shift modes include rotates, logical shifts in which 0 is shifted into any vacated bit positions, and arithmetic shifts in which the value of the original most significant bit is shifted into any vacated bit positions. The present invention includes a general 32-bit shifter that can shift an arbitrary number of places in a single cycle, using any of the modes described above.

Figure 1:
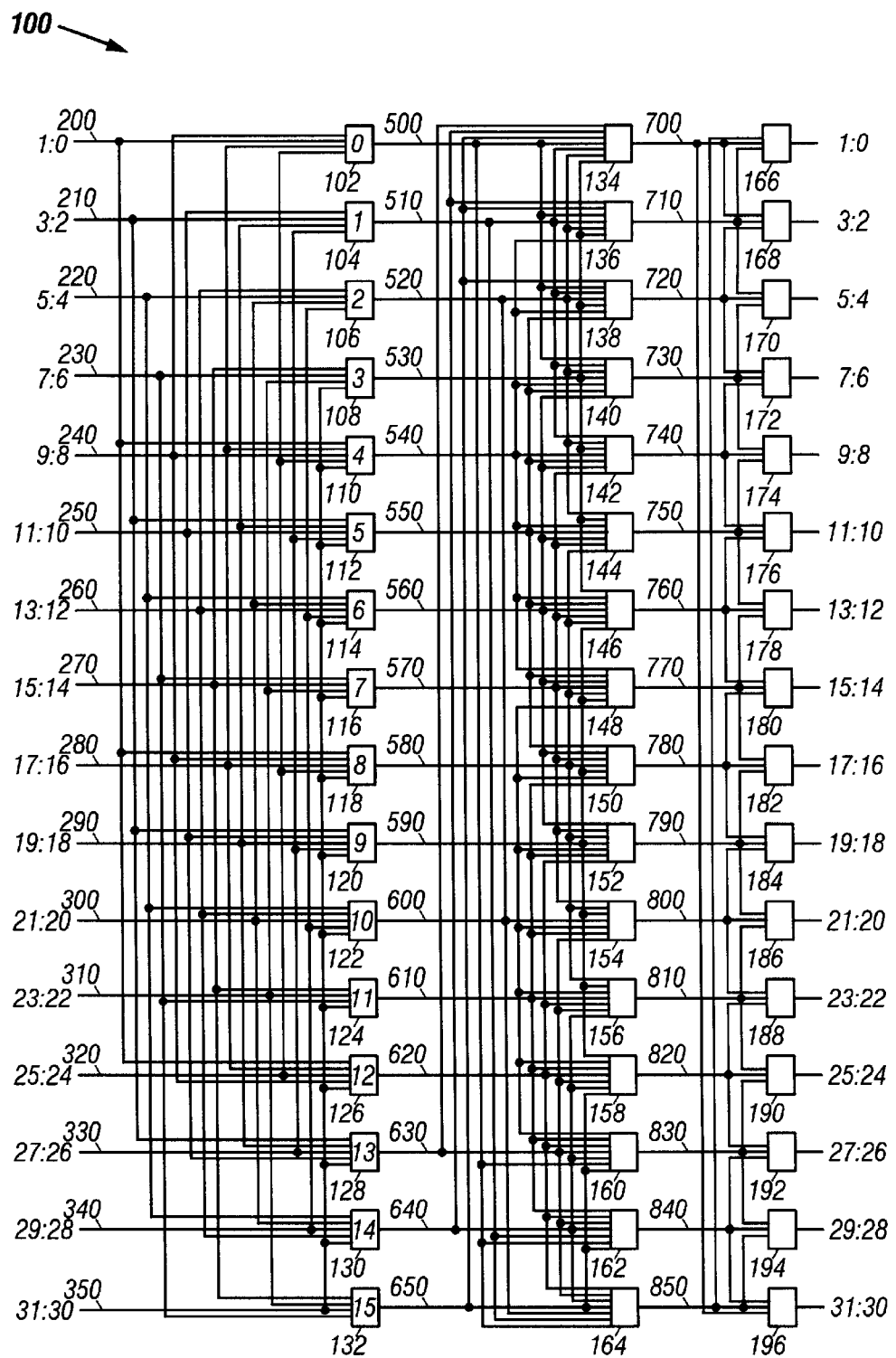
FIG. 1 shows a shifter according to one embodiment of the present invention.

encodings, including 1-of-4. The N-NARY logic family is described in a copending patent application, U.S. Pat. app. Ser. No. 09/019,355, filed Feb. 5, 1998, now U.S. Pat. No. 6,066,965, and titled "Method and Apparatus for a N-NARY logic Circuit Using 1-of-4 Encoding", which is incorporated herein for all purposes ("The N-NARY Patent"). In 1-of-4 encoding, four wires are used to indicate one of four possible values. In contrast, traditional static design uses two wires to indicate four values. "Traditional" dual-rail dynamic logic

TABLE 1

Range in which the number of bits of shift amount is determined

| | Rotate Right (in bits) | | | | Rotate Left (in bits) | | | | | | | |
|---|---|---|---|---|---|---|---|---|---|---|---|---|
| Mux | RR 0–7 | RR 8–15 | RR 16–23 | RR 24–31 | RL 0–7 | RL 8–15 | RL 16–23 | RL 24–31 | SL 0–7 | SL 8–15 | SL 16–23 | SL 24–31 |
| 0 | 0 | 4 | 8 | 12 | 0 | 12 | 8 | 4 | 0 | (null) | (null) | (null) |
| 1 | 1 | 5 | 9 | 13 | 1 | 13 | 9 | 5 | 1 | (null) | (null) | (null) |
| 2 | 2 | 6 | 10 | 14 | 2 | 14 | 10 | 6 | 2 | (null) | (null) | (null) |
| 3 | 3 | 7 | 11 | 15 | 3 | 15 | 11 | 7 | 3 | (null) | (null) | (null) |
| 4 | 4 | 8 | 12 | 0 | 4 | 0 | 12 | 6 | 4 | 0 | (null) | (null) |
| 5 | 5 | 9 | 13 | 1 | 5 | 1 | 13 | 9 | 5 | 1 | (null) | (null) |
| 6 | 6 | 10 | 14 | 2 | 6 | 2 | 14 | 10 | 6 | 2 | (null) | (null) |
| 7 | 7 | 11 | 15 | 3 | 7 | 3 | 15 | 11 | 7 | 3 | (null) | (null) |
| 8 | 8 | 12 | 0 | 4 | 8 | 4 | 0 | 12 | 8 | 4 | 0 | (null) |
| 9 | 9 | 13 | 1 | 5 | 9 | 5 | 1 | 13 | 9 | 5 | 1 | (null |
| 10 | 10 | 14 | 2 | 6 | 10 | 6 | 2 | 14 | 10 | 6 | 2 | (null) |
| 11 | 11 | 15 | 3 | 7 | 11 | 7 | 3 | 15 | 11 | 7 | 3 | (null) |
| 12 | 12 | 0 | 4 | 8 | 12 | 8 | 4 | 0 | 12 | 8 | 4 | 0 |
| 13 | 13 | 1 | 5 | 9 | 13 | 9 | 5 | 1 | 13 | 9 | 5 | 1 |
| 14 | 14 | 2 | 6 | 10 | 14 | 10 | 6 | 2 | 14 | 10 | 6 | 2 |
| 15 | 15 | 3 | 7 | 11 | 15 | 11 | 7 | 3 | 15 | 11 | 7 | 3 |
| Mux | | | | | LSR 0–7 | 8–15 | 16–23 | 24–31 | ASR 0–7 | 8–15 | 16–23 | 24–31 |
| 0 | | | | | 0 | 4 | 8 | 12 | 0 | 4 | 8 | 12 |
| 1 | | | | | 1 | 5 | 9 | 13 | 1 | 5 | 9 | 13 |
| 2 | | | | | 2 | 6 | 10 | 14 | 2 | 6 | 10 | 14 |
| 3 | | | | | 3 | 7 | 11 | 15 | 3 | 7 | 11 | 16 |
| 4 | | | | | 4 | 8 | 12 | (null) | 4 | 8 | 12 | 15 |
| 5 | | | | | 5 | 9 | 13 | (null) | 5 | 9 | 13 | 15 |
| 6 | | | | | 6 | 10 | 14 | (null) | 6 | 10 | 14 | 15 |
| 7 | | | | | 7 | 11 | 15 | (null) | 7 | 11 | 15 | 15 |
| 8 | | | | | 8 | 12 | (null) | (null) | 8 | 12 | 15 | 15 |
| 9 | | | | | 9 | 13 | (null) | (null) | 9 | 15 | 15 | 15 |
| 10 | | | | | 10 | 14 | (null) | (null) | 10 | 14 | 15 | 15 |
| 11 | | | | | 11 | 15 | (null) | (null) | 11 | 15 | 15 | 15 |
| 12 | | | | | 12 | (null) | (null) | (null) | 12 | 15 | 15 | 15 |
| 13 | | | | | 13 | (null) | (null) | (null) | 13 | 15 | 15 | 15 |
| 14 | | | | | 14 | (null) | (null) | (null) | 14 | 15 | 15 | 15 |
| 15 | | | | | 15 | (null) | (null) | (null) | 15 | 15 | 15 | 15 |

DETAILED DESCRIPTION OF THE INVENTION

The present invention comprises a 1 of 4 shifter that uses N-NARY logic. This disclosure describes numerous specific details and embodiments in order to provide a thorough understanding of the present invention. One skilled in the art will appreciate that one may practice the present invention without these specific details.

The present invention comprises a multi-function shifter that includes an operation selection and various 1-of-N multiplexers to support a variety of shift modes. The shift modes include rotates, logical shifts in which 0 is shifted into any vacated bit positions, and arithmetic shifts in which the value of the original most significant bit is shifted into any vacated bit positions. The present invention includes a general 32-bit shifter that can shift an arbitrary number of places in a single cycle, using any of the modes described above. N-NARY Logic The present invention utilizes the N-NARY logic family that supports a variety of signal also uses four wires to represent two bits, but the dual-rail scheme always requires two wires to be asserted. In contrast, N-NARY logic only requires assertion of one wire. The benefits of N-NARY logic over dual-rail logic, such as reduced power and reduced noise, should be apparent from a reading of The N-NARY Patent.

All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-NARY logic requires that a high voltage be asserted for all valid values, even 0. (Some versions of N-NARY logic allow a "null" case, where no high voltage is asserted for an N-NARY signal, which indicates that the N-NARY signal has not yet evaluated, and is not required). As illustrated in this specification and more thoroughly discussed in the N-NARY Patent, a 1 of N signal is used to convey multiple values of information in an integrated circuit. The 1 of N signal can convey information to and from an N-NARY logic circuit where an N-NARY logic circuit comprises a shared logic tree circuit that evaluates one or more 1 of N input signals and produces a 1 of N output signal. A single 1 of N signal comprises a bundle of N wires routed together between different cells (or different logic circuits) within a semiconductor device. A 1 of N signal uses a 1 of N encoding to indicate multiple values of information conveyed by the bundle of wires of the 1 of N signal where at most one and only one wire of the bundle of wires of the 1 of N signal is true during an evaluation cycle. The present invention further provides that the bundle of N wires may comprise a number of wires from the following group: a bundle of 3 wires, a bundle of 4 wires, a bundle of 8 wires, or a bundle of N wires. Additionally, the present invention may comprise a not valid value where zero wires of the bundle of N wires is active. Further, the present invention provides that the 1 of N encoding on the bundle of N wires cooperatively operate to reduce the power consumption in the integrated circuit according to the number of wires in the bundle of N wires evaluating per bit of encoded information.

N-NARY Transistor Groups

Another concept related to the N-NARY logic style is the concept of an N-NARY transistor group. An N-NARY transistor group is a group of transistors that are gated by wires belonging to a common N-NARY signal. When an N-NARY signal gates an N-NARY transistor group, each wire of the N-NARY signal is connected to the gate terminal of a distinct transistor of the N-NARY transistor group. The number of transistors in the N-NARY transistor groups is equal to the number of wires in the N-NARY signal. Because at most one wire of an N-NARY signal may be asserted at any time, the N-NARY logic style prevents more than one transistor in an N-NARY transistor group from conducting at any given time. In other words, the value of the N-NARY signal selects one of the transistors in the N-NARY transistor group and turns the selected transistor on, while turning the other transistors in the N-NARY transistor group off.

It may be that in a device an N-NARY signal gates multiple N-NARY transistor groups. These groups may be distinguished by the lack of a common non-gating terminal node. Although individual transistors may both have gate terminals connected to the same wire of the same N-NARY signal, if they have no direct connection between non-gate terminals then they do not belong to the same N-NARY transistor group.

A related concept is the concept of incomplete N-NARY transistor group. An incomplete N-NARY transistor group has fewer transistors than the N-NARY signal that gates its wires. Consequently, at least one wire of the gating N-NARY signal has no transistor to gate. Therefore, it is possible for the N-NARY signal to achieve a value that does not gate any transistor in the incomplete N-NARY transistor group. However, even in incomplete N-NARY transistor groups, it is not possible to turn on more than one transistor in the group. N-NARY transistor groups may be referred to as "complete" to highlight the fact that every wire of the gating N-NARY signal has a corresponding transistor to gate.

Generic N-NARY logic gate

Figure 2:
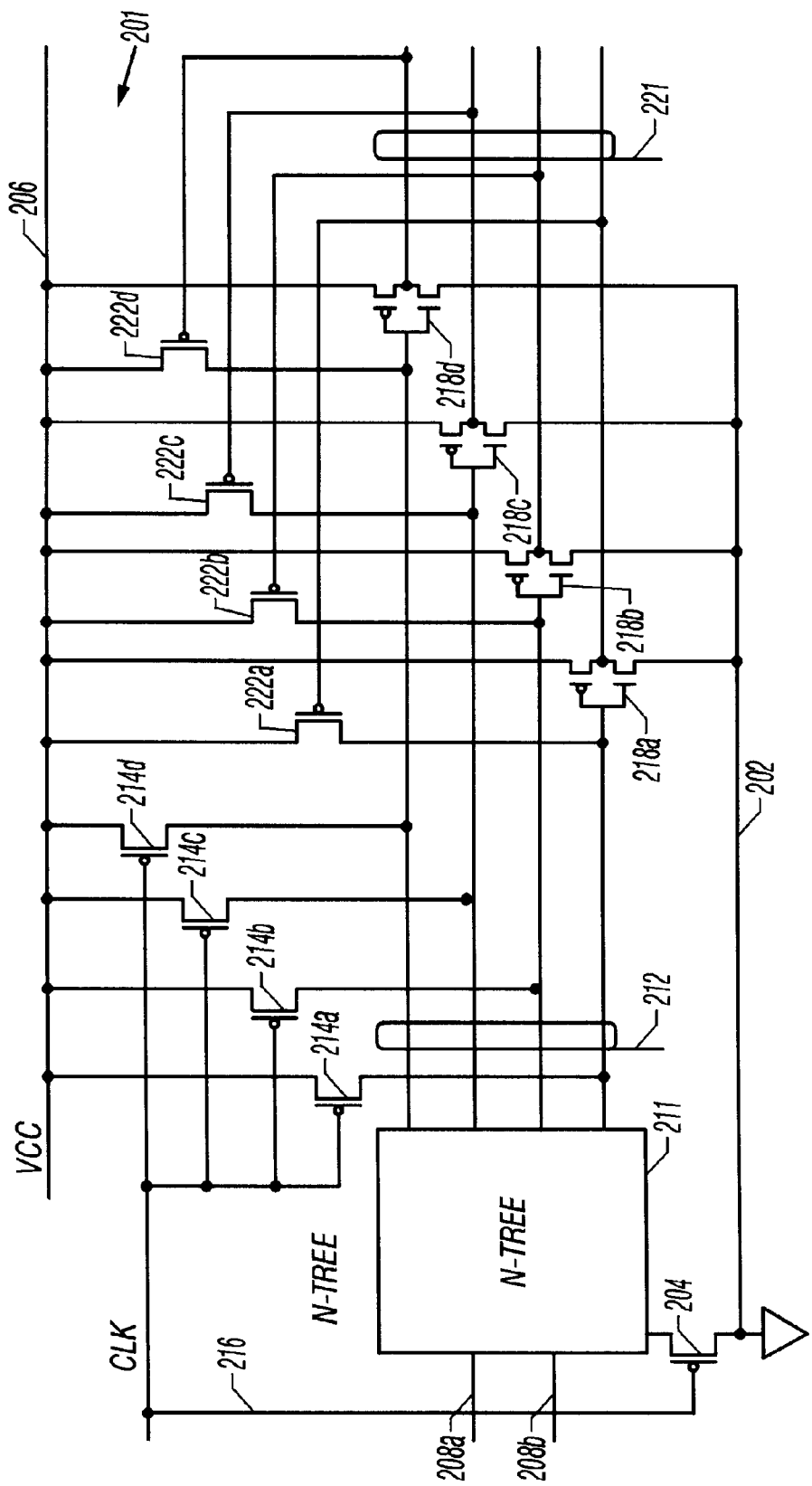
FIG. 2 shows a block diagram of a general N-NARY logic device according to one embodiment of the present invention

Referring now to FIG. 2, a general N-NARY logic gate is shown according to one embodiment of the present invention. The N-NARY Patent provides a much more detailed description and illustration of N-NARY logic and 1 of N signals. Briefly, the N-NARY logic gate 201 includes an N-tree 211 and other logic between a Vcc power 206 and a ground 202. The N-tree 211 receives one or more N-NARY signals such as 208*a* and 208*b*.

The N-tree 211 of FIG. 2 provides an N-NARY evaluate node 212, including four wires 212*a*–212*d*, although it will be understood that other numbers of wires are contemplated as well. The wires of the evaluate node 212 are such that at most one wire is asserted, and when data is ready exactly one wire is asserted.

The evaluate nodes 212*a*–212*d* are connected via several PMOS transistors 214*a*–214*d* to the power signal 206. The PMOS transistors 214*a*–214*d* are gated by a clock signal 216. The clock signal 216 also gates an nMOS transistor 204. During a portion of each clock cycle when the voltage on the clock signal 216 is low, meaning below the threshold voltage of the relevant transistors, the PMOS transistors 214*a*–214*d* provide a low-resistance path between the wires of the evaluate node 212 and the power signal 206. Also, the N-tree 211 is disconnected from the virtual ground signal 202, via nMOS transistor 204. The N-tree 211 is unable to provide any wire or node with a path to virtual ground, while the wires of the evaluate node are drawn to a high voltage across PMOS transistors 214*a*–214*d*.

During a subsequent portion of each clock cycle when the voltage on the clock signal 216 is high, meaning above the threshold voltage of the relevant transistors, the N-tree is provided a path across the nMOS transistor 204 to the ground 202. Moreover, the wires of the evaluate node 212 are allowed to "float" at a high voltage, as the PMOS transistors 214*a*–214*d* are open-circuited by a high gate voltage.

Included in the generic N-NARY logic gate of FIG. 2 are output inverters 218*a*–218*d*. The output inverters 218*a*–218*d* prevent glitches in the output by preventing the output signals from discharging across output signal 221 (output signal wires 221*a*–221*d*). The inputs of the output inverters 218*a*–218*d* are gate terminals of CMOS transistor pairs, and consequently drain very low currents, allowing the wires of evaluate node 212 to remain at the voltage determined by the PMOS transistors 214*a*–214*d* and the N-tree 211.

The generic N-NARY logic gate of 201 FIG. 2 also includes various keeper transistors. Keeper transistors 222*a*–222*d* ensures adequate current to the wires of the evaluate node 212. The generic N-NARY logic gate of FIG. 2 may be adapted to form a shifter, according to one embodiment of the present invention. The multiplexers of FIGS. 3–14, which comprise the shifter shown in FIG. 1, reside within the N-tree 208 of FIG. 2.

The Shifter Block

Referring now to FIG. 1, the shifter of the present invention provides many advantages including the ability to shift in stages or levels, either in a single cycle or over a number of cycles; providing a wide variety of shift operations in a coherent multiplexer structure; and allowing robust design flexibility by allowing implementations in both top select and bottom select multiplexer layouts.

As shifts consist nearly exclusively of translating bits from one position to another, shifters employ fairly simple logic gates (essentially muxes). The final level of the present embodiment is logically more complex due to the overhead of performing odd-bit shifts (i.e. shifts by odd shift amounts, necessitating a shift by 1 in some level) on dit-encoded data. As will be shown, this final level must split adjacent dits and splice them back together to form the result for the odd-bit case.

FIG. 1 illustrates one embodiment of the present invention that illustrates a shifter comprising several levels of multiplexers. Each multiplexer comprises a 1-of-4 output signal and several 1-of-4 input signals, although it will be appreciated that other widths of signals are contemplated (1 of 4 signals are a type of 1 of N signals where N=4). The received signals collectively form the received data value, but need not have uniform granularity. Each multiplexer also comprises several paths where each path within a multiplexer comprises a series of transistors, each gated by a wire belonging to a different input. Similarly, each input gates several transistors, each transistor gated by a particular input belonging to a distinct path, and the 1-of-N nature of the input prevents more than one such path from switching.

Structure of the Shifter Block

The shifter 100 of FIG. 1 comprises three levels of multiplexers, each level having 16 multiplexers. The first level includes multiplexers 102–132; the second level includes multiplexers 134–164; and the third level includes multiplexers 166–196. Each multiplexer in the shifter provides a 1-of-4 output signal. Each multiplexer in the first level receives one dit of the operand, and each multiplexer of the third level provides one dit of the output. Each multiplexer in the shifter may be identified by a level and by an index (from 0 to 15) within the appropriate level.

The block diagram in FIG. 1 shows the shifter to require a considerable amount of horizontal wire routing, particularly in the first and second levels. For a shift, any given bit of the output is potentially dependent on any one of the bits of the 32-bit input shift operand, depending on which of 32 shifts is to be performed. It will be recognized that shifts may be an odd number of bits (i.e., half-dits) despite the fact that the operand is received as a 1-of-4 signal. For arithmetic shifting, the sign bit (contained in dit 15) is routed to all dit positions into which it could be shifted in a given level. Therefore, all 32 bits of the input shift operand must be made available to each output bit, although this wire burden is frequently distributed across several levels of logic as in this implementation.

For this design, sixteen horizontal 1-of-4 signals (64 wires) are required in the first level, twelve signals (48 wires) in the second level, and four signals (sixteen wires) in the third level. This routing reflects additional overhead to support rotates that amounts to eight signals (six in the second level, two in the third level) that could be eliminated if rotates were not required.

Inputs to the Shifter Block

The shifter 100 illustrated in FIG. 1 has three sources of inputs with each source of input comprising an N-NARY 1 of N signal. The inputs to the shifter comprise a 1-of-4-encoded 32-bit quantity to be shifted (the operand), a 5-bit shift amount encoded as two 1-of-4 signals and one 1-of-2 signal, and one 1-of-5 shift control signal that selects the direction and mode of the shift to be performed from among the types discussed above. The output of the shifter is a 1-of-4 signal 32-bit shift result.

The first source of input to the shifter is a shift amount, part of the multiplex select wire circuitry. The shift amount is preferably implemented as ten physical wires including a first dit (two bits) implemented on four wires, a second dit (two bits) implemented on four wires, and a single 1-of-2 signal of two wires. The shift amount is therefore between 0 and 31 bits. Each level of the shifter responds to a different portion of the shift amount. For example, a shift of 25 bits is represented as a 3 (1-of-4) indicating a shift of three units of 8 bits (4 dits) in the first level, followed by a 0 (1-of-4) indicating no units of 2 bits (1 dit) in the second level, and followed by a 1 (1-of-2) indicating a further shift of one bit in the third level.

The first portion of the shift amount, or "most significant dit," is provided to the first level of the shifter. The first portion, of the shift amount is a 1-of-4 signal implemented on the first four physical wires of the shift amount and may be referred to as a "first-level shift amount." The first-level shift amount is the result of integer-dividing the shift amount by eight bits, representing a shift by a multiple of 8 bits (that is, a shift by 0, 8, 16, or 24 bits). Since the total shift amount is any value between 0 and 31 bits, the first-level shift amount is a 1-of-4 signal.

The second portion of the shift amount is provided to the second level of the shifter. The second portion of the shift amount, i.e., the next most significant dit, represents a shift by a multiple of 2 bits (that is, a shift by 0, 2, 4, or 6 bits). The second portion of the shift amount is a 1-of-4 signal implemented on the next four physical wires of the shift amount.

The third portion of the shift amount is less than a whole dit, being only one bit in size, and is either a 1 or a 0, indicating whether the shift amount reflects an odd or even number of bits. The third portion of the shift amount is provided to the third level of the shifter and is implemented on the last two wires of the shift amount.

For example, a 5-bit shift amount could be encoded as a shift of three bits in one level and a shift of two bits in another level. Such an alternative embodiment would have two levels, the first level being controlled by a 1-of-8 signal and the second level being controlled by a 1-of-4 signal. The 1-of-8 control signal would select multiples of 4 bits (two dits) and would be "dit granular." The 1-of-4 signal would select multiples of 1 bit (0, 1, 2, or 3 bits), and would be "bit granular" in its ability to command shifts of bit granularity. The overall shift would be equivalent to a shift of two bits in the first level, followed by a shift of two bits in the second level and a shift of one bit in the third level as in the described embodiment.

The second source of input to the shifter 100 of FIG. 1 is an operation indicator, which is a 1-of-5 signal indicating that the shifter is capable of performing any of the five shift control operations. The shift control operations include: rotate right, rotate left, shift left, arithmetic shift right, and logical shift right. Like the ten wires of the shift amount, the five wires of the operation indicator forms the remainder of the shifter multiplexer select wire circuitry, although the operation indicator is not decomposed into multiple portions.

The third source of input to the shifter is the actual data itself (i.e., the operand). The data are composed of "dits" or 1-of-4 signals. The 32-bit operand is encoded as 16 dits, each having four wires. However, the resulting 64 wires are only provided to the first level, four wires (one dit) to each multiplexer of the first level. The shifter is capable of receiving 16 dits simultaneously, encoding 32 bits of data.

First Level Logic

Figure 3:
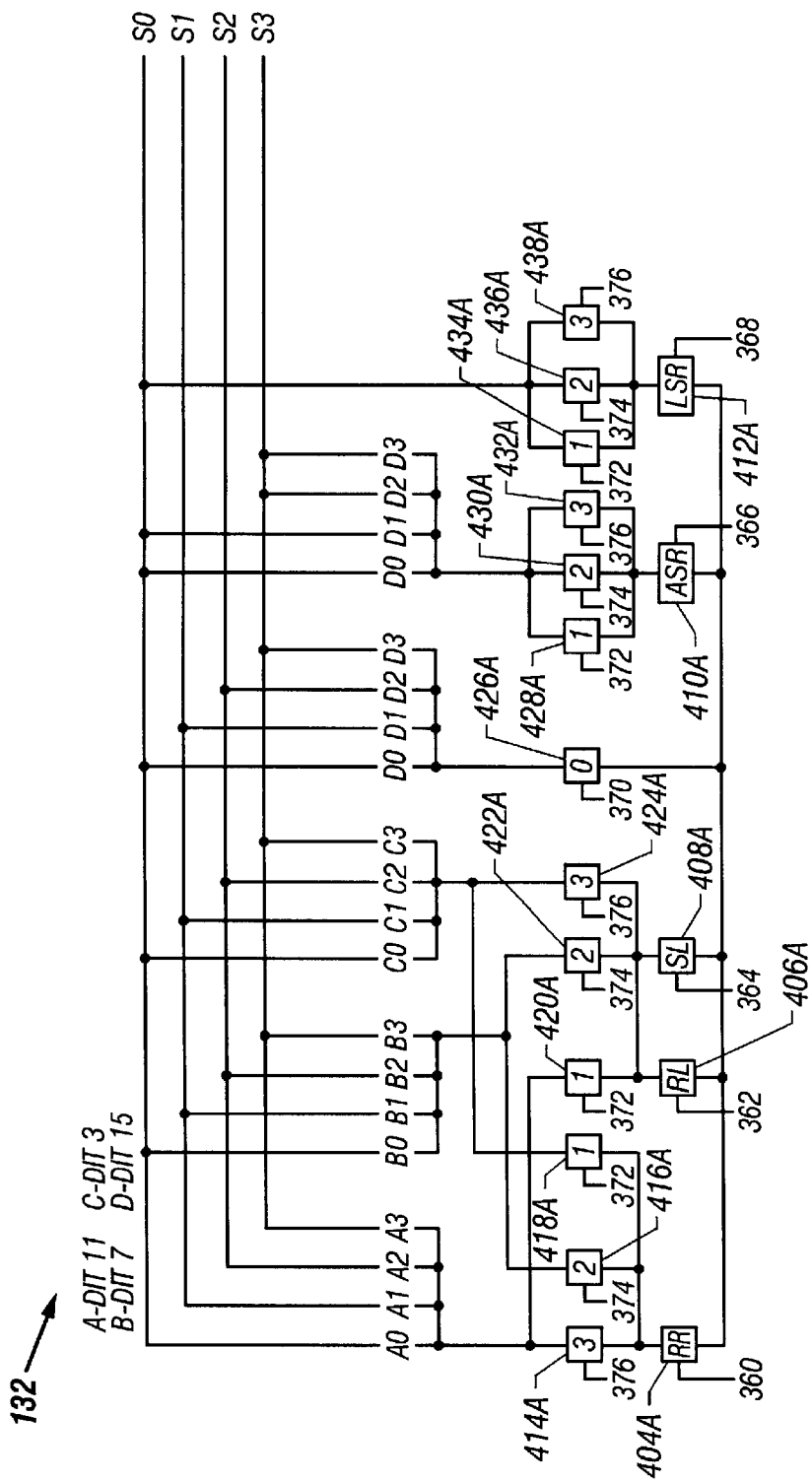
FIG. 3 shows a first multiplexer of the shifter of FIG. 1.
Figure 4:
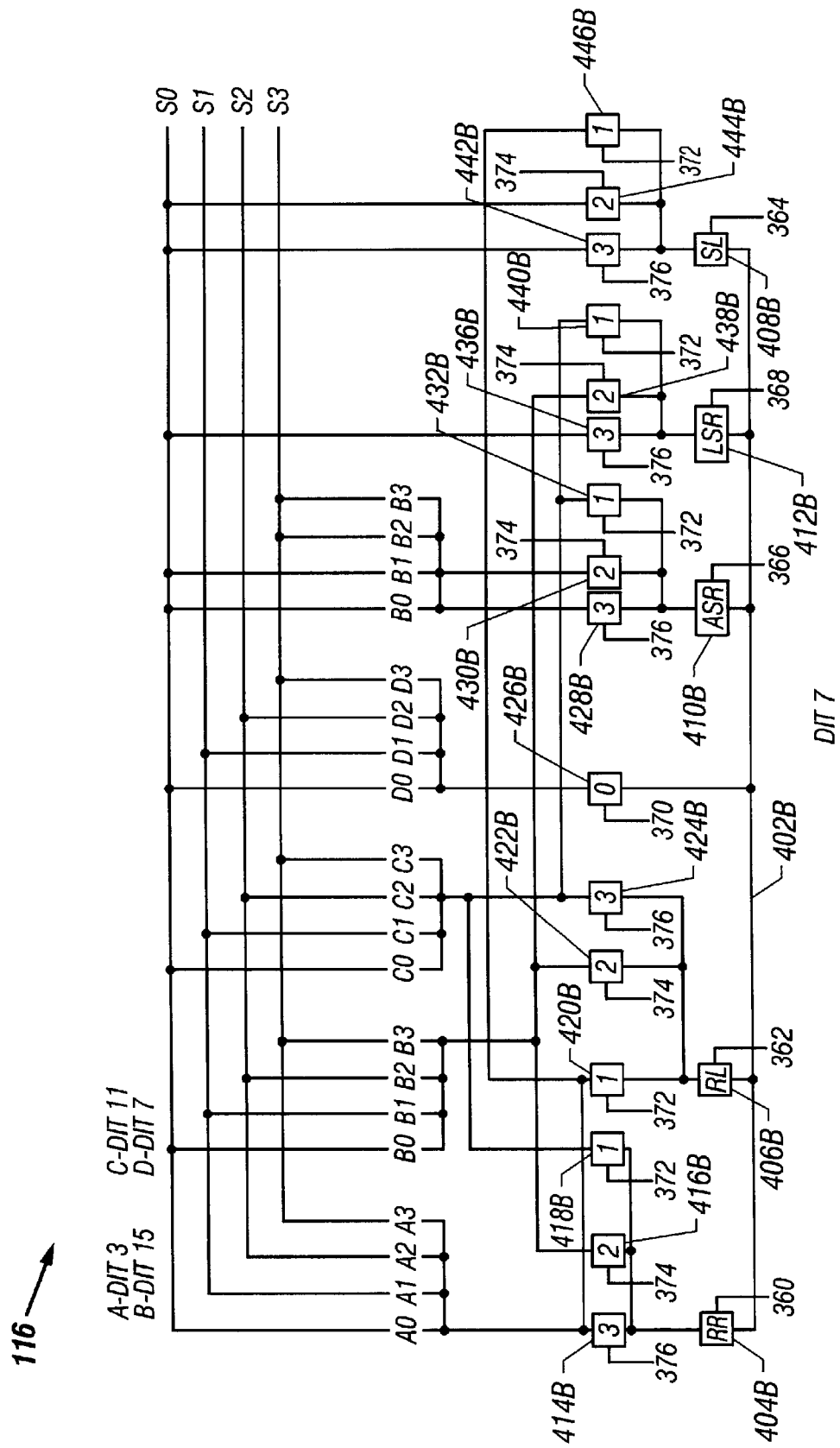
FIG. 4 shows a second multiplexer of the shifter of FIG. 1.
Figure 5:
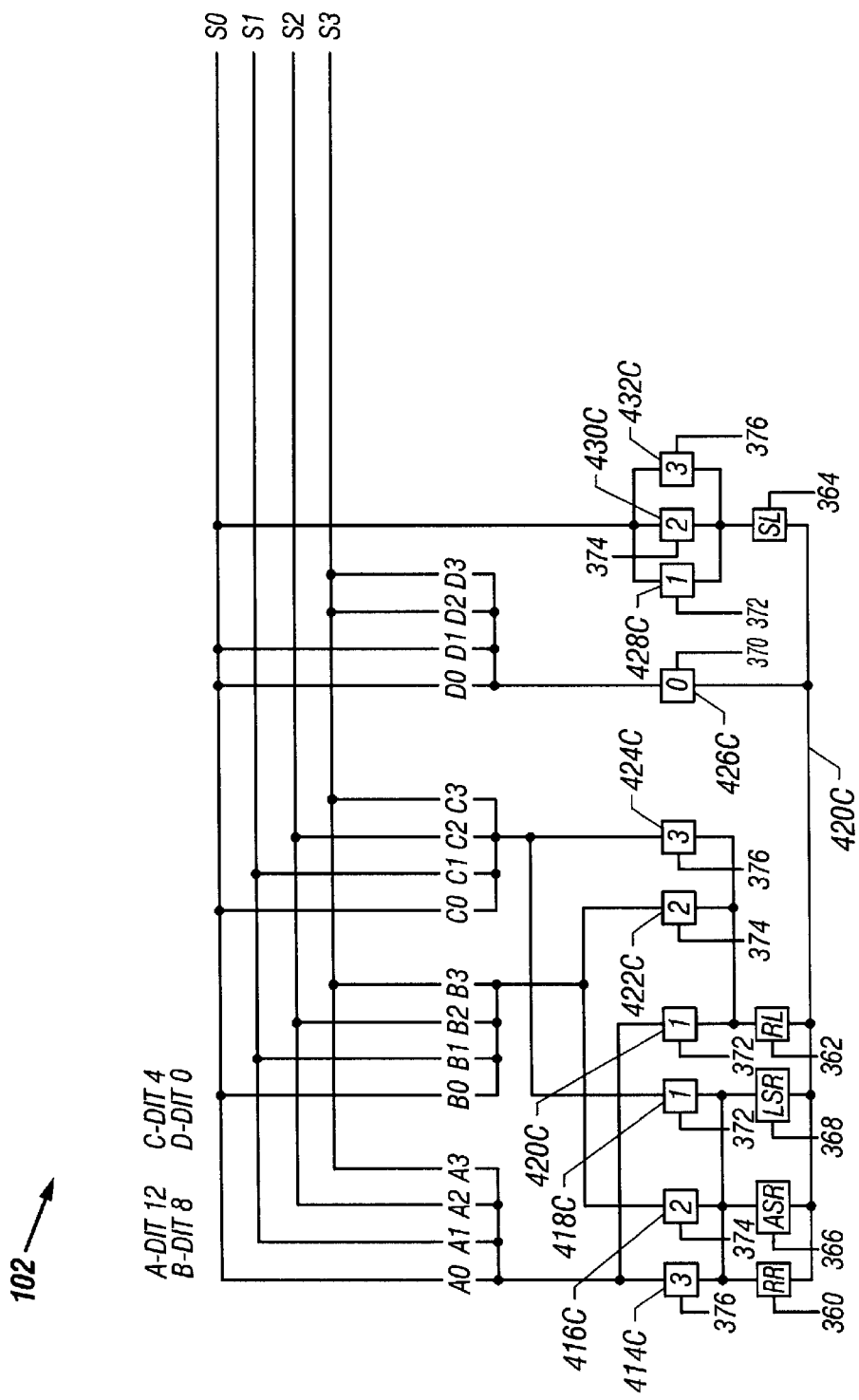
FIG. 5 shows a third multiplexer of the shifter of FIG. 1.

Referring now to FIGS. 3–5, gates representative of those comprising the first logic level are shown. These gates illustrate the subtle differences in gate structure across the width of the shifter due to variations in the interactions between shifts and rotates as they approach the logical extremes of the shifter. Each gate is referred to by the number of the dit the gates produces. The sixteen gates numbered 0–15 in the first level produce output dits 0–15, respectively.

Referring specifically to FIG. 3, a schematic diagram of multiplexer 132, as shown in FIG. 1, is selectively coupled to signal 230, 270, 310, or 350, according to one of the operation wires 360 to 368 (gating transistors 404A–412A) and a first-level shift amount indicator 370 to 376. As stated above, the shift amount value comprises a most significant dit implemented as a 1-of-4 first-level shift amount value determined by integer-dividing the initial shift amount by 8-bits. The four wires of the first-level shift amount are applied to the gate terminals of various transistors in the multiplexer shown in FIG. 3.

Specifically, when the first-level shift amount is 0, corresponding to an initial shift amount less than eight bits, transistor 426A is turned on. When the first-level shift amount is 1, indicating that the initial shift amount field is between eight bits and 15 bits, the wire provided to the gate terminals of transistors 418A, 420A, 428A and 434A turns these transistors on. When the first-level shift amount is 2, indicating that the initial shift amount field value is between 16 and 23 bits, the wire applied to transistors 416A, 422A, 430A and 436A is asserted, turning these transistors on. When the first-level shift amount is 3, indicating that the initial shift amount field value is between 24 and 31 bits, the wire applied to transistors 414A, 424A, 432A and 438A is asserted, turning these transistors on.

As shown in FIG. 3 for the most significant dit, dit 15 (as for all other dit positions in the first level), the gate structure reflects that a rotate right by a first-level shift amount value of 1 (or eight bits in this level) is identical to a rotate left by a first-level shift amount value of 3 (or twenty-four bits in this level) and vice versa; rotates left and right by a first-level shift amount value of 2 are also identical. This enables a reduction in the number of devices required due to the rotate cases sharing nodes, and is a technique used commonly throughout the shifter. Additionally, in the most significant dit position, shift left is identical to rotate left, and is combined with that case. An arithmetic shift right of any amount results in the selection of a first-level shift amount of either 0 or 3 for this dit, depending on the most significant bit. A logical shift right results in the selection of 0 for this dit.

As shown in FIG. 3, a virtual ground node 402A is coupled to the source terminals of five transistors 404A, 406A, 408A, 410A, and 412A. The gate terminals of transistors 404A–412A are each individually coupled to a distinct one of the operation wires 360–368. Specifically, the rotate right wire 360 is coupled to the gate terminal of transistor 404A, the rotate left wire 362 is coupled to the gate terminal of transistor 406A, the shift left wire 364 is coupled to the gate terminal of transistor 408A, the arithmetic shift right wire 366 is coupled to the gate terminal of transistor 410A, and the logical shift right wire 368 is coupled to the gate terminal of transistor 412A. Therefore, the operation wires 360–368 selectively couple 1-of-5 wire nodes to the virtual ground 402A. The source terminals of transistors 404A–412A form five nodes. Since, only one of the wires gating transistors 404A–412A may be asserted at any one time, only one of the source terminal nodes of transistors 404A–412A has a path to the virtual ground node 402A at any one time.

Referring again to FIG. 3, the drain terminals of the N-MOS transistors 414A–426A each select a distinct input signal for mapping to the multiplexer output wires. Specifically, transistor 414A and transistor 420A select input signal 320 (FIG. 1); transistors 416A and 422A select input signal 270 (FIG. 1); transistors 418A and 424A select input signal 230 (FIG. 1); and transistor 426A–438A select input signal 350 (FIG. 1). It will be noted that transistor 426A is only driven when a first-level shift amount of zero is selected, a condition that prevents any of transistors 414A–424A and 428A–438A from being driven. Similarly, transistor 410A, which is driven by operation wire 366 and selects input signal 350 for mapping to the output wires of the multiplexer, cannot be driven simultaneously with transistors 404A to 408A or 412A, since only one of the operation select wires may be asserted at any time (the operation select wire is a 1 of 5 signal).

It will be recognized upon reference to FIG. 3 that the arrangement of the transistors 404A–412A gated by the operation wires 360–368, in combination with the transistors 414A–438A gated by the range group wires 370–376, provide only one path between the drain terminal of any transistor 414A–438A and the virtual ground mode 402A. The shift operator signal gates exactly are of transistors 404A–412A, since exactly one wire of the shift operator signal is asserted. Similarly, at most one of the transistors coupled to the source terminal of any of transistors 404A–412A can be on, since such transistors are gated by distinct wires of an N-NARY signal. Consequently, no two of the transistors 414A–438A can simultaneously gate the drain terminal through to the virtual ground node 402A. Consequently, at most one output wire (S0–S3) is discharged and the output is a valid 1-of-N signal. FIG. 3 shows transistors gated by the operation wires as having source terminals tied directly to the virtual ground node. However, the multiplexer of FIG. 3 may also be easily implemented for the transistors gated by the first-level shift amount wires to be tied directly to the virtual ground node. Such an alternate implementation may have the transistors gated by the operation wires connected with source terminals tied to the gate terminals of the transistors gated by the first-level shift amount wires. In other words, the various select wires may be implemented in the reverse order.

Other Gates of the First Level

FIG. 4 illustrates a device 116 that is a similar design implemented to that illustrated in FIG. 3. Specifically, when the first-level shift amount value is 0, corresponding to an amount less than eight bits, transistor 426B is turned on. When the first-level shift amount value is 1, indicating that the shift amount field is between eight bits and 15 bits, the wire provided to the gate terminals of transistors 418B, 420B, 432B, 440B, and 446B and turns these transistors on. When the first-level shift amount value is 2, indicating that the shift amount field value is between 16 and 23 bits, the wire applied to transistors 416B, 422B, 430B, 438B and 440B is asserted, turning these transistors on. When the first-level shift amount value is 3, indicating that the shift amount field value is between 24 and 31 bits, the signal provided is applied to transistors 414B, 424B, 428B, 436B, and 442B.

As shown in FIG. 4, as for all other dit positions in the first level the gate structure of dit 7 reflects that a rotate right by a first-level shift amount of 1 (or eight bits in this level) is identical to a rotate left by a first-level shift amount of 3 (or twenty-four bits in this level) and vice versa; rotates left and right by a first-level shift amount of 2 are also identical.

FIG. 4 shows a virtual ground node 402B that is coupled to the source terminals of five transistors 404B, 406B, 408B, 410B, and 412B. The gate terminals of transistors 404B–412B are each individually coupled to a distinct one of the operation wires 360–368. Specifically, the rotate right wire 360 is coupled to the gate terminal of transistor 404B, the rotate left wire 362 is coupled to the gate of transistor 406B, the shift left wire 364 is coupled to the gate terminal of transistor 408B, the arithmetic shift right wire 366 is coupled to the gate terminal of transistor 410B, and the logical shift right wire 368 is coupled to the gate terminal of transistor 412B. The operation wires 360–368 therefore selectively coupled 1-of-5 wire nodes to the virtual ground 402B. The source terminals of transistors 404B–412B form five nodes. Since only one of the wires gating transistors 404B–412B may be asserted at any one time, only one of the source terminal nodes of transistors 414B–446B (not including 426B) as has a path to the virtual ground node 402B at any one time.

The drain terminals of the N-MOS transistors 414B–446B each select a distinct input signal (FIG. 1) for mapping to the multiplexer output wires. Specifically, transistor 414B, 420B, and 446B select input signal 230 (FIG. 1), whose four wires each gate one of transistors A0–A3; transistors 416B, 442B, 438B, 430B, and 438B select input signal 350 (FIG. 1), whose four wires each gate one of transistors B0–B3; transistors 418B, 424B, 432B, and 440B, whose four wires each gate one of transistors C0–C3; and transistor 426B select input 270 (FIG. 1), whose four wires each gate one of transistors D0–D3. Transistors 436B, 442B, and 444B each gate either transistor 412B or 408B directly to an output. It will be noted that transistor 426B is only driven when first-level shift amount zero is selected, a condition that prevents any of transistors 414B–424B and 428B–446B from being driven. Similarly, transistor 410B, which is driven by operation wire 366 and selects input signal 350B for mapping to the output wires of the multiplexer, cannot be driven simultaneously with transistors 404B–408B, and 412B, since only one of the operation select wires may be asserted at any time (the operation select wire is a 1 of 5 signal). The rotates are able to share nodes. However, shift left is identical with rotate left only for a shift first-level shift amount of 1, and must select 0 for greater amounts. Arithmetic and logical shift right overlap with rotate right for a shift first-level shift amount of 1, but the former must select the sign bit and the latter, 0, for greater amounts. As shown in the previous multiplexer in FIG. 3, the multiplexer of FIG. 4 shows an arrangement of the transistors gated by the operation wires 360–368, that in combination with the transistors gated by the first level shift amount wires 370–376 (in a manner as illustrated in FIG. 3), provide only one path between the drain terminal of any transistor 404B–426B and the virtual ground node 402B. The shift operation signal gates exactly one of transistors 404B–412B, since exactly one wire of the shift operation signal is asserted. Similarly, at most one of the transistors coupled to the source terminal of any of transistors 404B–412B can be on, since such transistors are gated by distinct wires of an N-NARY signal. It will also be noticed that no two of the transistors 414B–446B can simultaneously gate the drain terminal through to the virtual ground node 402B.

Referring now to FIG. 5 that illustrates device 102, it will be recalled that the first portion of the shift amount value is a 1-of-4 dit, determined by integer-dividing the first-level shift amount by 8-bits. The wires of this signal are applied to the gate terminals of various transistors in the multiplexer shown in FIG. 5. Specifically, when the first-level shift amount is 0, corresponding to an amount less than eight bits, transistor 426C is turned on. When the first-level shift amount is 1, indicating that the shift amount field is between eight bits and 15 bits, the wire provided to the gate terminals of transistors 418C, 420C, and 428C turns these transistors on. When the first-level shift amount is 2, indicating that the shift amount field value is between 16 and 23 bits, the wire applied to transistors 416C, 422C, and 430C is asserted, turning these transistors on. When the first-level shift amount is 3, indicating that the shift amount field value is between 24 and 31 bits, the wire applied to transistors 414C, 424C, and 432 is asserted, turning these transistors on. The gate structure shown in FIG. 5 reflects that a rotate right by an amount of 1 (or eight bits in this level) is identical to a rotate left by a first-level shift amount of 3 (or twenty-four bits in this level) and vice versa; rotates left and right by a first-level shift amount of 2 are also identical.

FIG. 5 shows that the gate for dit 0 is even simpler than for dit 15, since at this end, both arithmetic and logical shift right are identical with rotate right. Shift left selects 0 for any shift amount. Transistors 404C–412C selectively select the shift amount. Transistors 404C–412C selectively select the drain terminal of one of the transistors 404C–412C to the virtual ground node 402C, the selected drain terminal being coupled to the exclusion of the drain terminals of the other transistors 404C through 412C. The drain terminal of the selected transistor selects either one of input signals 200, 240, 280, or 320, or a predetermined value, to the output wires of the multiplexer.

A virtual ground node 402C is coupled to the source terminals of five transistors 404C, 406C, 408C, 410C, and 412C. The drain terminals of transistors 404C–412C are each individually coupled to a distinct one of the operation wires 360–368 (in a manner as illustrated in FIG. 3). Specifically, the rotate right wire 360 is coupled to the gate terminal of transistor 404C, the rotate left wire 362 is coupled to the gate of transistor 406C, the shift left wire 364C is coupled to the gate terminal of transistor 408C, the arithmetic shift right wire 366 is coupled to the gate terminal of transistor 410C, and the logical shift right wire 368 is coupled to the gate terminal of transistor 412C. Therefore, the operation wires 360–368 selectively couple 1-of-5 wire nodes to the virtual ground 402C. The source terminals of transistors 404C–412C form five nodes. Since, only one of the wires gating transistors 404C–412C may be asserted at any one time, only one of the source terminal nodes of transistors 414C–432C (except 426C) has a path to the virtual ground node 402C at any one time.

The drain terminals of the transistors 414C–426C each select a distinct input signal for mapping to the multiplexer output wires. Specifically, transistor 414C and transistor 420C select input signal 320 (FIG. 1); transistors 416C and 422C select input signal 280 (FIG. 1); transistors 418C and 424C select input signal 240 (FIG. 1); and transistor 426C selects input signal 200 (FIG. 1). It will be noted that transistor 426C is only driven when the first level shift amount of 0 is selected, a condition that prevents any of transistors 414C–424C from being driven. Transistors 428C–432C select no input, but drive the output to a predetermined state. Similarly, transistor 410C, which is driven by operation wire 366 and selects input signal 200 for mapping to the output wires of the multiplexer, cannot be driven simultaneously with transistors 404C–408C and 412C, since only one of the operation select wires may be asserted at any time (the operation select wire is a 1 of 5 signal).

As noted above with respect to other figures, it will be recognized upon reference to FIG. 5 that the arrangement of the transistors gated by the operation wires 360–368, in combination with the transistors gated by the range group wires 370–376, provide only one path between the drain terminal of any transistor 404C–432C and the virtual ground node 402C. It will also be noticed that no two of the transistors 414C–432C can simultaneously gate the drain terminal through to the virtual ground node 402C.

The Remaining Multiplexers of the First Level

For every dit position, numbered 0 (least significant) to 15 (most significant), a shift count of 0 always selects the input data at the current dit position.

For every dit position, data selected by a rotate left with a shift count of 1 is the same as data selected by a rotate right with a shift count of 3, and is equivalent to the fourth dit of input data to the right of the current dit position, modulo sixteen dits (i.e., wrapping from the least significant to the most significant dit when necessary).

For every dit position, data selected by a rotate left with a shift count of 2 is the same as data selected by a rotate right with a shift count of 2, and is equivalent to the eighth dit of input data to the right of the current dit position, modulo sixteen dits.

For every dit position, data selected by a rotate left with a shift count of 3 is the same as data selected by a rotate right with a shift count of 1, and is equivalent to the twelfth dit of input data to the right of the current dit position, modulo sixteen dits.

For any given dit position, if the index of the current dit position minus 4, 8, or 12, respectively, is greater than or equal to 0, then data selected by a shift left with a shift count of 1, 2, or 3 is equivalent to the fourth, eighth, or twelfth dit of input data to the right of the current dit position, respectively (which for the 32-bit shifter is identical to the case for rotate left). Otherwise, the selected data is forced to 0.

For any given dit position, if the index of the current dit position plus 4, 8, or 12, respectively, is less than or equal to 15, then data selected by an arithmetic or logical shift right with a shift count of 1, 2, or 3 is equivalent to the fourth, eighth, or twelfth dit of input data to the left of the current dit position, respectively (which for the 32-bit shifter is identical to the case for rotate right). Otherwise, for an arithmetic shift right the selected data is forced to equal the original sign bit appropriately replicated (e.g. 0 if the sign bit was 0 and 3 if the sign bit was 1); for a logical shift right the selected data is forced to 0.

The Second Level

The second level operates much as the first level, but the 1-of-4 signal received by each second-level multiplexer is obtained from a first-level multiplexer, rather than from a dit of the original received data value, i.e. the shift operand. Also, the portion of the shift operation received by each multiplexer is the second portion (wires 5 through 8 of the shift amount's ten wires). It will also be recalled that the first-level multiplexers each receive four distinct dits of the operand, since shifts and rotates frequently share nodes in the 32-bit shifter. However, in the second level, the multiplexers each receive seven signals, plus one fixed value, since node sharing is decreased relative to the first level.

Figure 6:
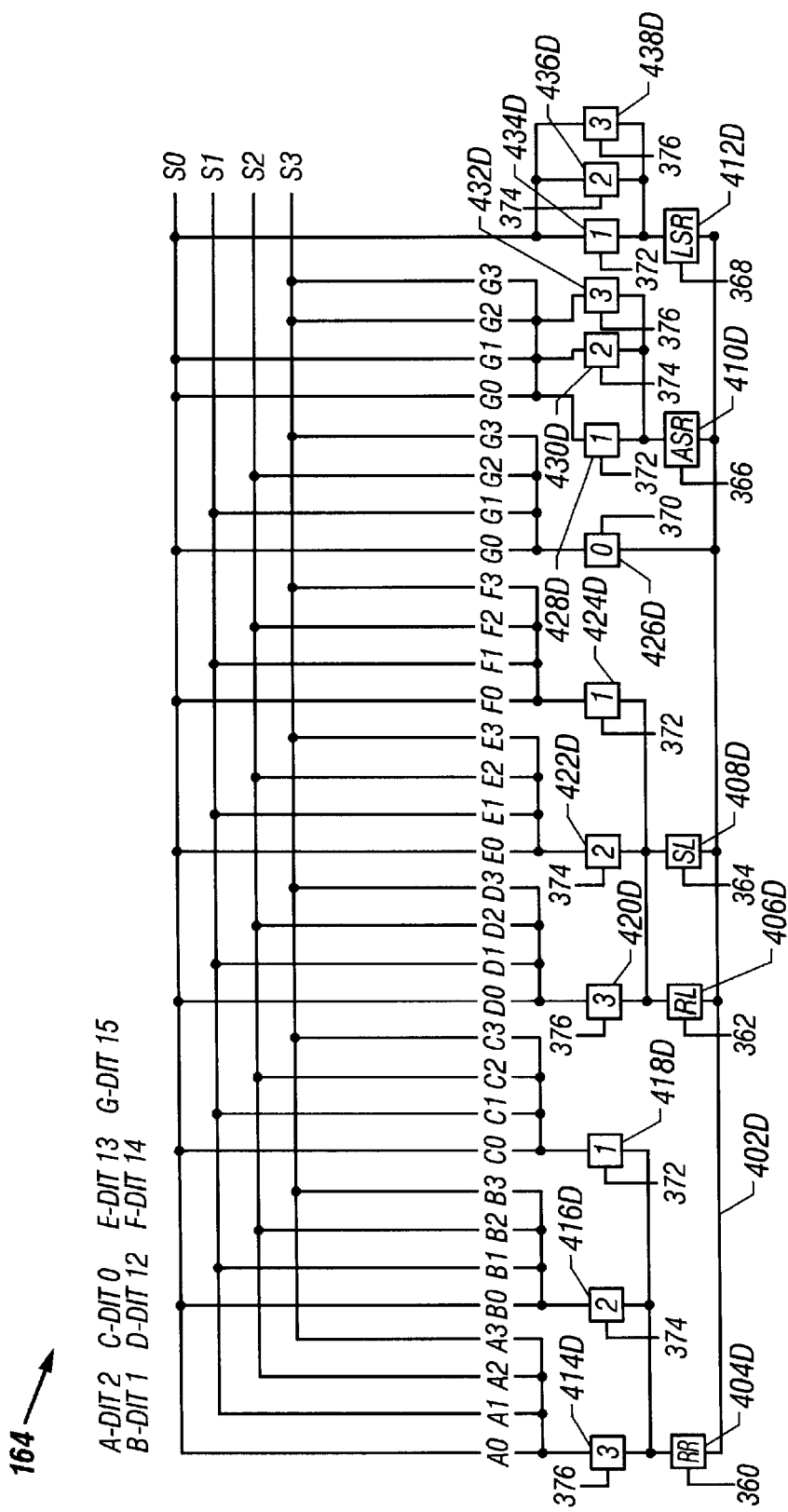
FIG. 6 shows a fourth multiplexer of the shifter of FIG. 1.

Referring now to FIG. 6, multiplexer 164 responds to the second dit implemented as a 1-of-4 second-level shift amount determined by integer-dividing the remainder of the first integer division by 2-bits. The resulting signal is applied to the gate terminals of various transistors in the multiplexer shown in FIG. 5. Specifically, when the second-level shift amount is 0, corresponding to a shift amount of either 0–1 bits, 8–9 bits, 16–17 bits, or 24–25 bits, transistor 426D is turned on. When the value of the second-level shift amount is 1, indicating that the shift amount field of either 2–3 bits, 10–11 bits, 18–19 bits, or 26–27 bits, the wire provided to the gate terminals of transistors 418D, 424D, 428D, and 434D and turns these transistors on. When the value of the second-level shift amount is 2, corresponding to a shift amount of either 4–5 bits, 12–13 bits, 20–21 bits, or 28–29 bits, the wire applied to transistors 416D and 422D is asserted, turning these transistors on. When the value of the second-level shift amount is 3, indicating a shift amount of either 6–7 bits, 14–15 bits, 22–23 bits, or 30–31 bits, then the wire applied to transistors 414D and 424D is asserted, turning these transistors on.

In the second level, the shift depends on the second dit of the shift amount field. Additionally, in the most significant dit position, shift left is identical to rotate left, and is combined with that case. An arithmetic shift right of any amount results in the selection of either 0 or 3 for this dit, depending on the most significant bit. A logical shift right results in the selection of 0 for this dit.

A virtual ground node 402D couples to the source terminals of five transistors 404D, 406D, 408D, 410D, and 412D. The drain terminals of transistors 404D–412D are each individually coupled to a distinct one of the operation wires 360–368. Specifically, the rotate right wire 360 is coupled to the gate terminal of transistor 404D, the rotate left wire 362 is coupled to the gate terminal of transistor 406D, the shift left wire 364 is coupled to the gate terminal of transistor 408D, the arithmetic shift right wire 366 is coupled to the gate terminal of transistor 410D, and the logical shift right wire 368 is coupled to the gate terminal of transistor 412D. Therefore, the operation wires 360–368 selectively couple 1-of-5 wire nodes to the virtual ground 402D. The source terminals of transistors 404D–412D form five nodes. Because the wires 360–368 collectively form a single N-NARY signal, only one of the wires 360–368 may be asserted at anytime. Consequently, no two of transistors 404D–412D may be "on" simultaneously. Since only one of the wires gating transistors 404D–412D may be asserted at any one time, only one of the source terminal nodes of transistors 414D–438D (excepting 426D) has a path to the virtual ground node 402D at any one time.

The drain terminals of transistors 414D–438D each select a distinct input signal from the first level for mapping to the multiplexer output wires. Specifically, transistor 414D selects input signal 520 (FIG. 1); transistor 416D selects input signal 510 (FIG. 1); transistor 418D selects input signal 500 (FIG. 1); transistor 420D selects input signal 620 (FIG. 1); transistor 422D selects input signal 630 (FIG. 1); transistor 424D selects input signal 640 (FIG. 1); transistors 426D–432D select input signal 650 (FIG. 1); and transistors 434D–438D select no input signal but drive a value of zero (1-of-4 signal) onto the output wires. It will be noted that transistors 404D–412D and 414D–438D collectively ensure that at most one of the input signals 500, 510, and 520 (FIG. 1) and 620, 630, 640, and 650 (FIG. 1) has a path the virtual ground node 402D.

Figure 7:
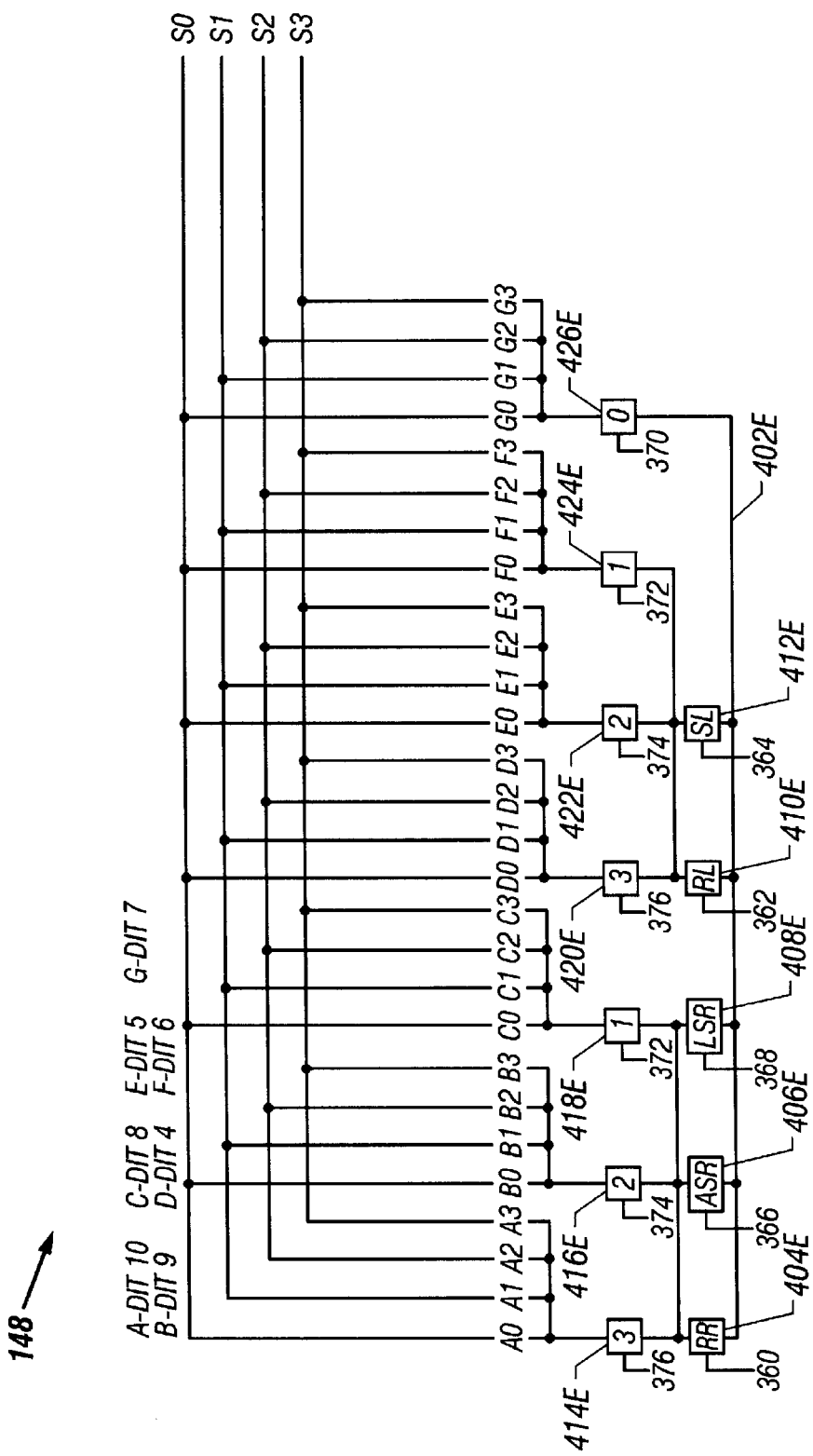
FIG. 7 shows a fifth multiplexer of the shifter of FIG. 1.

FIG. 7 illustrates that the multiplexer 148 of the second level also responds to the second dit implemented as a 1-of-4 second-level shift amount. The resulting signal is applied to the gate terminals of various transistors in the multiplexer shown in FIG. 7. Specifically, when the second-level shift amount is 0, corresponding a shift to a shift amount of either 0–1 bits, 8–9 bits, 16–17 bits, or 24–25 bits, transistor 426E is turned on. When the value of the second-level shift amount is 1, indicating a shift amount field of either 2–3 bits, 10–11 bits, 18–19 bits, or 26–27 bits, the wire provided to the gate terminals of transistors 418E and 424E and turns these transistors on. When the value of the second-level shift amount is 2, indicating a shift amount of either 4–5 bits, 12–13 bits, 20–21 bits, or 28–29 bits, the wire applied to transistors 416E and 422E is asserted, turning these transistors on. When the value of the second-level shift amount is 3, indicating a shift amount of either 6–7 bits, 14–15 bits, 22–23 bits, or 30–31 bits, then the wire indicating that the shift amount field value is between 24 and 31 bits, is applied to transistors 414E and 420E and turns those transistors on.

A virtual ground node 402E is coupled to the source terminals of five transistors 404E, 406E, 408E, 410E, and 412E. Transistors 404E–412E form an N-NARY transistor group gated by the operation signal; the drain terminals of transistors 404E–412E are each individually coupled to a distinct one of the operation wires 360–368. Specifically, the rotate right wire 360 is coupled to the gate terminal of transistor 404E, the rotate left wire 362 is coupled to the gate of transistor 406E, the shift left wire 364 is coupled to the gate terminal of transistor 408E, the arithmetic shift right wire 366 is coupled to the gate terminal of transistor 410E, and the logical shift right wire 368 is coupled to the gate terminal of transistor 412E. The source terminals of transistors 404E–412E form five nodes. Since only one of the wires gating transistors 404E–412E may be asserted at any one time, only one of the source terminal nodes of transistors 414E–424E has a path to the virtual ground node 402E at any one time.

Each of the transistors 414E–426E selects a distinct N-NARY transistor group, gated by a distinct input signal from the first level. Specifically, transistor 414E selects input signal 600 (FIG. 1); transistor 416E selects input signal 590 (FIG. 1); transistors 418E selects input signal 580 (FIG. 1); transistor 420E selects input signal 540 (FIG. 1); transistor 422E selects input signal 550 (FIG. 1); transistor 424E selects input signal 560 (FIG. 1); and transistor 426E selects input signal 570 (FIG. 1).

Figure 8:
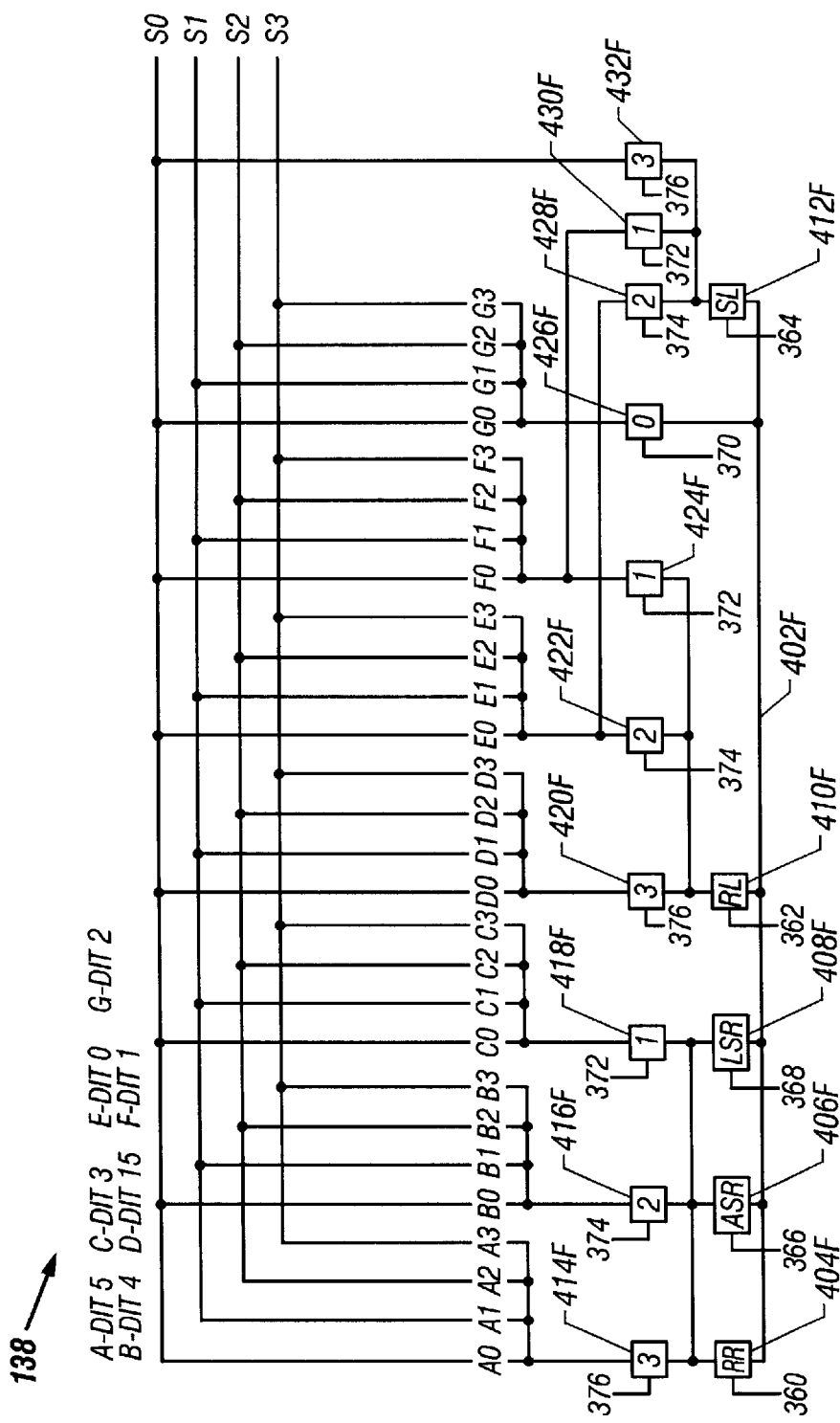
FIG. 8 shows a sixth multiplexer of the shifter of FIG. 1.

FIG. 8 illustrates that multiplexer 2 also responds to the second dit implemented as a 1-of-4 second-level shift amount. The resulting signal is applied to the gate terminals of various transistors in the multiplexer shown in FIG. 8. Specifically, when the second-level shift amount is 0, corresponding to a shift an amount of either 0–1 bits, 8–9 bits, 16–17 bits, or 24–25 bits, transistor 426F is turned on. When the value of the second-level shift amount is 1, indicating a shift amount field of either 2–3 bits, 10–11 bits, 18–19 bits, or 26–27 bits, the wire provided to the gate terminals of transistors 418F, 424F, and 430F is asserted and turns these transistors on. When the value of the second-level shift amount is 2, indicating a shift amount of either 4–5 bits, 12–13 bits, 20–21 bits, or 28–29 bits, the wire applied to transistors 416F, 422F, and 428F is asserted, turning these transistors on. When the value of the second-level shift amount is 3, indicating a shift amount of either 6–7 bits, 14–15 bits, 22–23 bits, or 30–31 bits, then the wire applied to transistors 414F, 420F, and 432F is asserted, turning these transistors on.

A virtual ground node 402F is coupled to the source terminals of five transistors 404F, 406F, 408F, 410F, and 412F. Transistors 404F–412F form an N-NARY transistor group gated by the operation signal; the drain terminals of transistors 404F–412F are each individually coupled to a distinct one of the operation wires 360–368. Specifically, the rotate right wire 360 is coupled to the gate terminal of transistor 404F, the rotate left wire 362 is coupled to the gate of transistor 406F, the shift left wire 364 is coupled to the gate terminal of transistor 408F, the arithmetic shift right wire 366 is coupled to the gate terminal of transistor 410F, and the logical shift right wire 368 is coupled to the gate terminal of transistor 412F. The source terminals of transistors 404F–408F are tied together to form a node; the source terminal of transistor 410F forms a node; and the source terminal of transistor 412F form a node. Since only one of the wires gating transistors 404F–412F may be asserted at any one time, only one of these nodes has a path to the virtual ground node 402F at any one time.

The drain terminals of transistors 414F–432F each selects a distinct complete N-NARY transistor group gated by a distinct input signal from the first level. Specifically, transistor 414F selects input signal 550 (FIG. 1); transistor 416F selects input signal 540 (FIG. 1); and transistor 418F selects input signal 530 (FIG. 1). Also, transistor 420F selects input signal 650 (FIG. 1); transistors 422F and 428F select input signal 500 (FIG. 1); transistors 424F and 430F select input signal 510 (FIG. 1); transistor 426F selects input signal 520 (FIG. 1); and transistor 432F selects no input signal but drives a value of zero (1-of-4 signal) onto the output signal.

Remaining Multiplexers of the Second Level

For every dit position, a shift count of 0 always selects the input data at the current dit position.

For any given dit position, data selected by a rotate left is equivalent to the first, second, or third dit of input data to the right of the current dit position, modulo sixteen dits.

For any given dit position, data selected by a rotate right is equivalent to the first, second, or third dit of input data to the left of the current dit position, modulo sixteen dits.

For any given dit position, if the index of the current dit position minus 1, 2, or 3, respectively, is greater than or equal to 0, then data selected by a shift left with a shift count of 1, 2, or 3 is equivalent to the first, second, or third dit of input data to the right of the current dit position, respectively (which for the 32-bit shifter is identical to the case for rotate left). Otherwise, the selected data is forced to 0.

For any given dit position, if the index of the current dit position plus 1, 2, or 3, respectively, is greater than or equal to 0, then data selected by an arithmetic or logical shift right with a shift count of 1, 2, or 3 is equivalent to the first, second, or third dit of input data to the left of the current dit position, respectively (which for the 32-bit shifter is identical to the case for rotate left). otherwise, for an arithmetic shift right the selected data is forced to equal the original sign bit appropriately replicated (e.g. 0 if the sign bit was 0 and 3 if the sign bit was 1); for a logical shift right the selected data is forced to 0.

The Third Level

Figure 9:
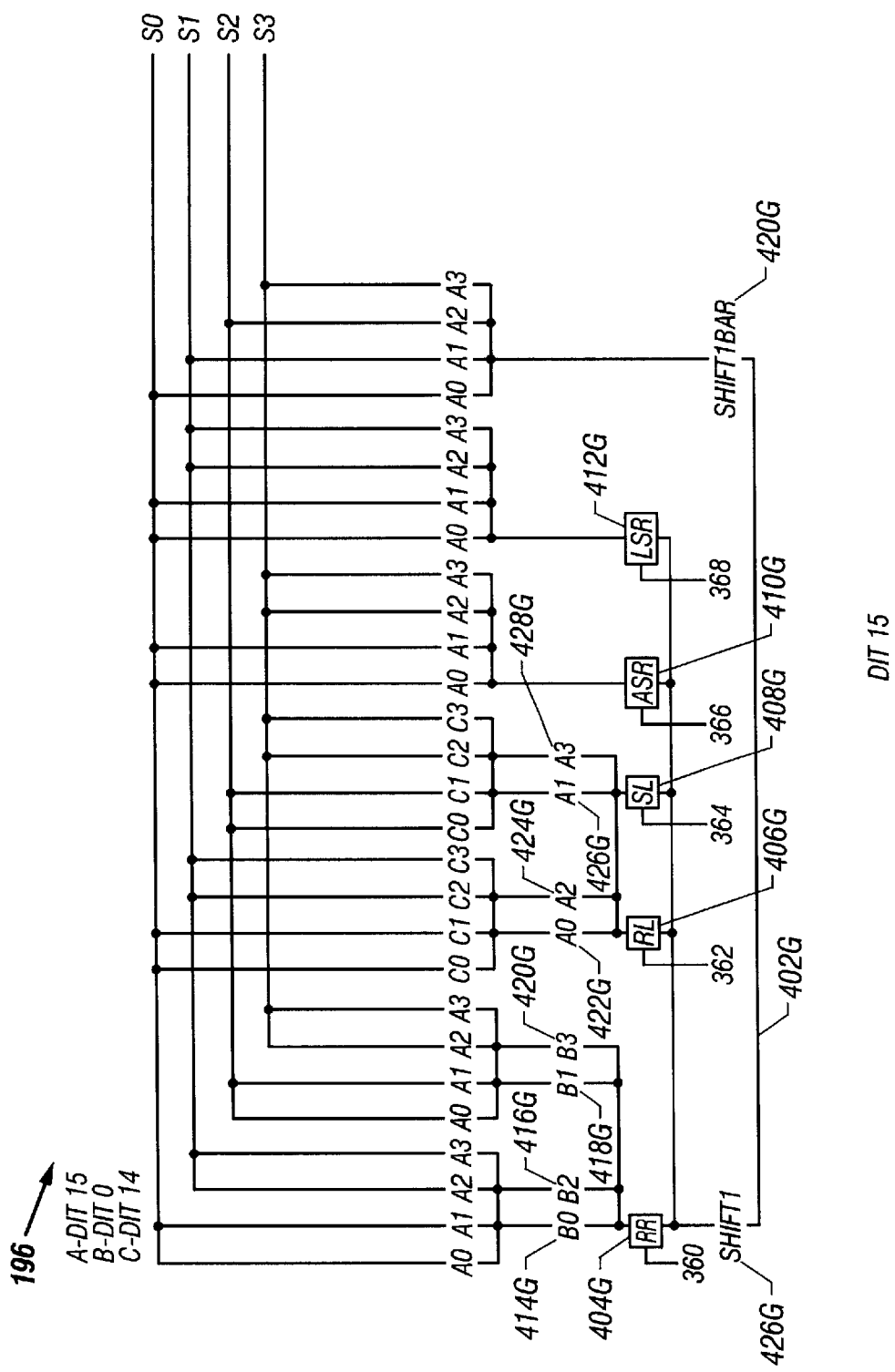
FIG. 9 shows a seventh multiplexer of the shifter of FIG. 1.
Figure 10:
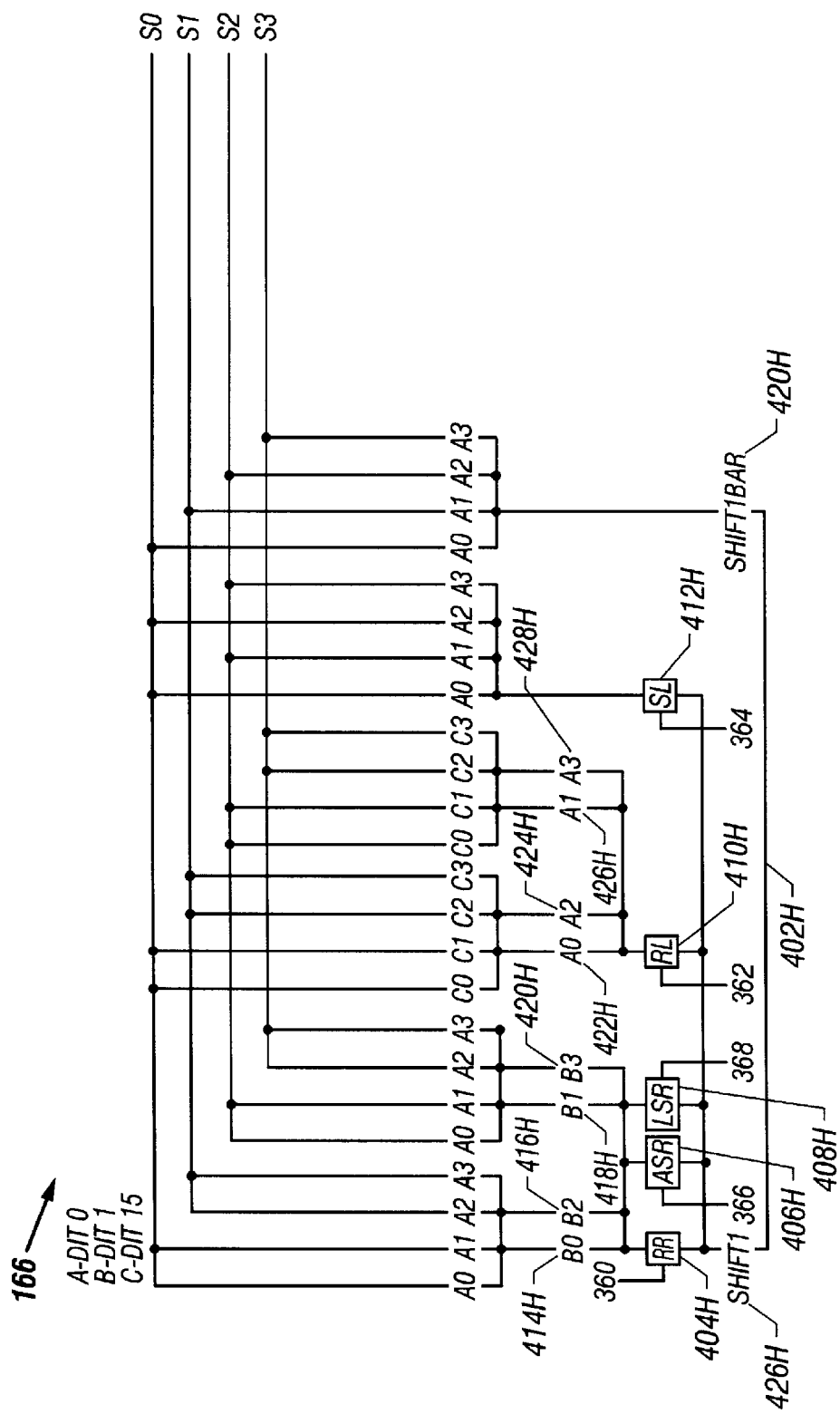
FIG. 10 shows an eighth multiplexer of the shifter of FIG. 1.
Figure 11:
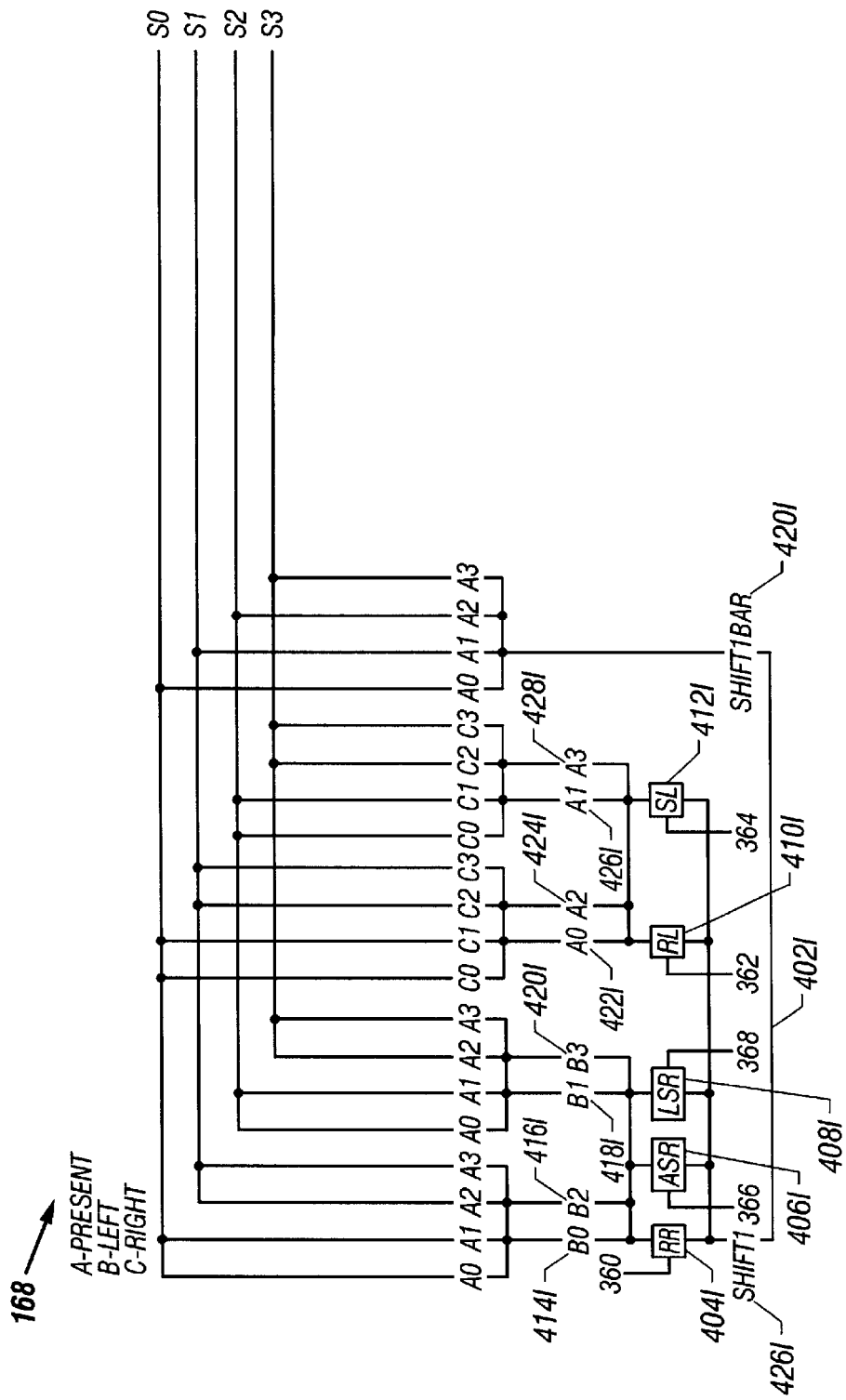
FIG. 11 shows a ninth multiplexer of the shifter of FIG. 1.

Gates representative of those in the third level are shown in FIGS. 9–11. Although in this level the mux select is only 1-of-2 versus 1-of-4, implying fewer select cases and simpler logic, these gates are actually the most complex in the entire shifter. This complexity arises out of the difficulty of shifting a dit-encoded quantity by a single bit position to yield a dit-encoded quantity; logically, this gate must consider both a given dit and its neighbors on either side in addition to the shift amount and direction. This results in an evaluate stack height of four devices for this level, versus three for the first and second levels. This complexity is slightly offset by an increase in the number of dits for where shift and rotate cases combine, as an extension of the effect seen in the second level.

As stated above, the shift amount value comprises a 1-of-2 signal implemented as two physical wires, "shift1" and "shift1bar". The value is applied to the gate terminals of various transistors in the multiplexer 196 shown in FIG. 9. Specifically, when the value is shift1, corresponding to a shift amount representing an odd number of bits, transistor 426G is turned on. When the 1-of-2 value is shift1bar, corresponding to a shift amount representing an even number of bits, transistor 420G is turned on. Practically all of the symmetry available in the first two levels is missing in the third level, except for the coincidence of shift and rotate.

For dit 15, if the shift amount is not 1, dit 15 is passed through unmodified. Otherwise, a shift occurs. Shift left and rotate left overlap, and both "splice" dit 15 with its right neighbor, dit 14. Rotate right "splices" dit 15 with its left neighbor, dit 0. Arithmetic and logical shift right do not splice, instead selecting the sign bit or 0, respectively. Dit 0 is fundamentally identical to dit 15 in structure, except that the right shifts and rotate overlap.

As shown in FIG. 9, devices 196 comprises a virtual ground node 402G coupled to the source terminals of five transistors 404G, 406G, 408G, 410G, and 412G. Transistors 404G–412G form an N-NARY transistor group gated by the operation signal; the drain terminals of transistors 404G through 412G are each individually coupled to a distinct one of the operation wires 360–368. Specifically, the rotate right wire 360 is coupled to the gate terminal of transistor 404G, the rotate left wire 362 is coupled to the gate of transistor 406G, the shift left wire 364 is coupled to the gate terminal of transistor 408G, the arithmetic shift right wire 366 is coupled to the gate terminal of transistor 410G, and the logical shift right wire 368 is coupled to the gate terminal of transistor 412G. Since only one of the wires gating transistors 404G–412G may be asserted at any one time, only one of the source nodes of transistors 414G–426G (excepting 426G and 420G) as has a path to the virtual ground node 402G at any one time.

FIG. 9 illustrates that the drain terminals of the N-MOS transistors 414G–428G each selects a distinct complete N-NARY transistor group gated by a distinct input signal from the first level. Specifically, transistors 414G–420G select input signal 850 (FIG. 1); and transistors 422G–428G select input signal 840 (FIG. 1). Transistors 410G–412G select input signal 850 (FIG. 1) as well. Transistors 404G–408G form an incomplete N-NARY transistor group providing transistors 414G–428G with a path to virtual ground node 402G. When none of the transistors 404G–408G is selected, transistors 410G and 412G select distinct N-NARY transistor groups gated by distinct input signals from the first level. Specifically, transistors 410G–412G select input signal 850 (FIG. 1).

As shown in FIG. 10, device 166 comprises a virtual ground node 402H coupled to the source terminals of five transistors 404H, 406H, 408H, 410H, and 412H. For dit 7, maximal overlap is achieved between shifts and rotates. Transistors 404H–412H form an N-NARY transistor group gated by the operation signal; the drain terminals of transistors 404H–412H are each individually coupled to a distinct one of the operation wires 360–368. Specifically, the rotate right wire 360 is coupled to the gate terminal of transistor 404H, the rotate left wire 362 is coupled to the gate terminal of transistor 410H, the shift left wire 364 is coupled to the gate terminal of transistor 412H, the arithmetic shift right wire 366 is coupled to the gate terminal of transistor 406G, and the logical shift right wire 368 is coupled to the gate terminal of transistor 408H. Therefore, the operation wires 360–368 selectively connect 1-of-5 wire nodes to the virtual ground 402H. Since only one of the wires gating transistors 404H–412H may be asserted at any one time, only one of the source terminal nodes of transistors 414H–428H (except 420H and 428H) has a path to the virtual ground node 402H at any one time.

FIG. 10 shows that the drain terminals of the N-MOS transistors 414H–428H each select a distinct input signal and a distinct N-NARY transistor group gated by the selected input signal. Specifically, transistors 414H–422H select input signal 700 (FIG. 1); transistors 422H–428H select input signal 850 (FIG. 1); transistor 412H selects input signal 700 (FIG. 1).

FIG. 11 illustrates the remaining multiplexers of the third level by showing in detail multiplexer 168 of FIG. 1. The remaining multiplexers of the third level operate in a similar manner as illustrated in FIG. 11, a virtual ground node 402I is coupled to the source terminals of five transistors 404I, 406I, 408I, 410I, and 412I. Transistors 404I–412I form an N-NARY transistor group gated by the operation signal; the drain terminals of transistors 404I–412I are each individually coupled to a distinct one of the operation wires 360–368. Specifically, the rotate right wire 360 is coupled to the gate terminal of transistor 404I, the rotate left wire 362 is coupled to the gate terminal of transistor 410I, the shift left wire 364 is coupled to the gate terminal of transistor 412I, the arithmetic shift right wire 366 is coupled to the gate terminal of transistor 406I, and the logical shift right wire 368 is coupled to the gate terminal of transistor 408H. Therefore, the operation wires 360–368 selectively connect 1-of-5 wire nodes to the virtual ground 402I Since only one of the wires gating transistors 404I–412I may be asserted at any one time, only one of the source terminal nodes of transistors 414I–428I (except 420I and 428I) has a path to the virtual ground node 402I at any one time.

The drain terminals of the transistors 414I–428I each select a distinct input signal and a distinct N-NARY transistor group gated by the selected input signal. Specifically, transistors 414I–420I select input signal 710 (FIG. 1); transistors 422I–428I select input signal 700 (FIG. 1).

General Description of Third Level Multiplexers

For every dit position, a shift count of 0 always selects the input data at the current dit position.

For the most significant dit position (dit 15), data selected by a rotate left or shift left with a shift count of 1 is equivalent to the less significant bit of the current dit concatenated (left to right) with the more significant bit of the first dit to the right. Data selected by a rotate right with a shift count of 1 is equivalent to the less significant bit of the least significant dit concatenated (left to right) with the more significant bit of the current dit. Data selected by a logical shift right with a shift count of 1 is equivalent to a bit value of zero concatenated (left to right) with the more significant bit of the current dit. Data selected by an arithmetic shift right with a shift count of 1 is equivalent to the value of the sign bit concatenated (left to right) with the more significant bit of the current dit.

For the least significant dit position (dit 0), data selected by a rotate left with a shift count of 1 is equivalent to the less significant bit of the current dit concatenated (left to right) with the more significant bit of the most significant dit. Data selected by a shift left with a shift count of 1 is equivalent to the less significant bit of the current dit concatenated (left to right) with a bit value of zero. Data selected by a rotate right, arithmetic shift right, or logical shift right with a shift count of 1 is equivalent to the less significant bit of the first dit to the left concatenated (left to right) with the more significant bit of the current dit.

For all other dit positions, data selected by a rotate left or shift left with a shift count of 1 is equivalent to the less significant bit of the current dit concatenated (left to right) with the more significant bit of the first dit to the right. Data selected by a rotate right, arithmetic shift right, or logical shift right with a shift count of 1 is equivalent to the less significant bit of the first dit to the left concatenated (left to right) with the more insignificant bit of the current dit.

Top Select

An alternative embodiment of the present inventions uses multiplexers implemented in an inverted form. In an inverted implementation, each of the 1-of-N muxes with a 1-of-N encoded select wire would exhibit ideal capacitance isolation (and therefore gate performance) when the select devices are placed on the top of the evaluate stack since only the selected stack will be allowed to couple onto the evaluate node. Of course, the benefits of capacitance isolation in a top-select form are obtained at the expense of simplicity. If the data is 1-of-M encoded, i.e. as a set of signals where each signal can take on any node of M states, then as many as NM select devices could be required for this arrangement, whereas only N select devices are required if placed at the bottom of the stack. Data arriving later than the select may also warrant consideration of placing data at the top of the stack and selects below.

For simplicity of representation, the multiplexers illustrated in this disclosure are all bottom-select. Where capacitance-isolation problems exist, they may be dealt with by isolating troublesome nodes in the output stage, rearrangement of select devices to the top of the stack on such nodes, or a combination of these.

Figure 12:
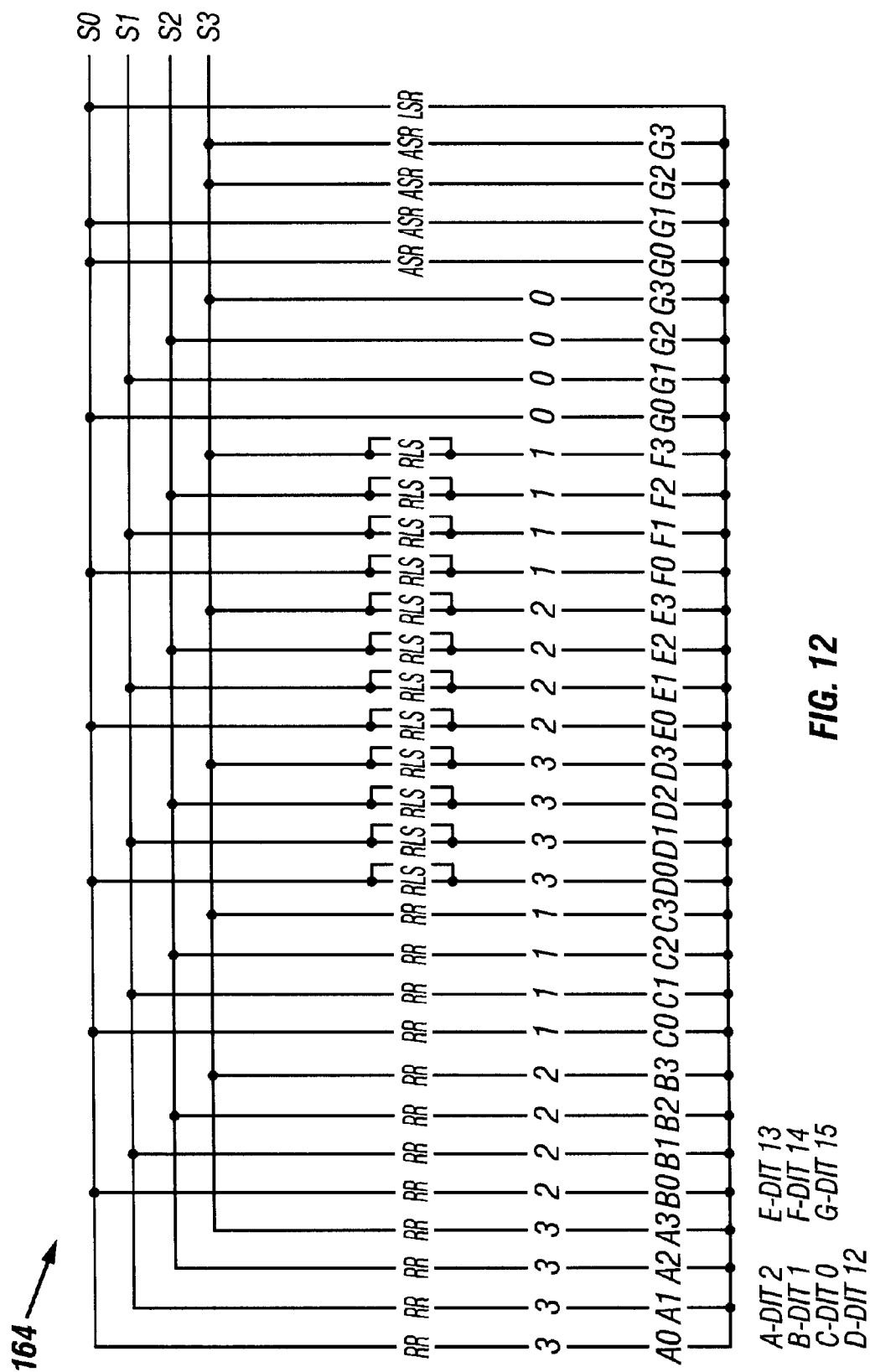
FIG. 12 shows alternate embodiments of the multiplexer of FIG. 6.

FIG. 6 shows the fourth multiplexer 164 of the shifter according to a first embodiment; FIG. 12 illustrates an alternate embodiment of the fourth multiplexer 164 that illustrates greater capacitance isolation, at the expense of complexity. Specifically, internal nodes within the multiplexer of FIG. 6 may collect charge when the inputs switch states. For example, a first node at the drain terminal of transistor 426D is connected to a first transistor group gated by input G (dit 15). When input G evaluates, one of the transistors in the first transistor group provides a connection from one of the wires belonging to the evaluate node to the node at the drain terminal of transistor 426D. Similarly, a second node at the drain terminals of transistors 428D–432D is connected to a second transistor group also gated by input G (dit 15). When input G evaluates, one of the transistors in the second transistor group provides a connection from one of the wires belonging to the evaluate node to the node at the drain terminal of transistors 428D–432D.

It will be recalled that at the beginning of the evaluate phase of the clock cycle the various wires of the output have been left at a high voltage ("floating" at a high voltage) through the placement of residual charge, as described in reference to transistors 214a–214d of FIG. 2. If any charge has been left on any intermediate node from a previous clock cycle, when input G evaluates such charge may flow back into the evaluate node, and then through the evaluate node and into the path to virtual ground (402D), adding to the amount of charge which must be discharged to ground for the gate to switch. This latter effect can be detrimental to the overall timing of the gate. For example, the evaluation of input G provides a path from one of these two intermediate nodes to the other through the wires belonging to the evaluate node.

Referring back to FIG. 12, it will be noticed that the number of intermediate nodes coupled to the evaluate node wires is greatly reduced in size. Each node in FIG. 12 couples to two transistors. Each node couples to one transistor at a source terminal and couples to one transistor at a drain terminal. The reduced size of each node allows far less charge to accumulate. Moreover, far less charge is available to flow into the evaluate node. For the remaining dits, shifts and rotates overlap for each direction, reducing gate complexity slightly versus that of the endcase dits.

To summarize, the present invention comprises a multi-function shifter that includes an operation selection and various 1-of-N multiplexers to support a variety of shift modes. The shift modes include rotates, logical shifts in which 0 is shifted into any vacated bit positions, and arithmetic shifts in which the value of the original most significant bit is shifted into any vacated bit positions. The present invention includes a general 32-bit shifter that can shift an arbitrary number of places in a single cycle, using any of the modes described above.

Other embodiments of the invention will be apparent to those skilled in the art after considering this specification or practicing the disclosed invention. The specification and examples above are exemplary only, with the true scope of the invention being indicated by the following claims.

We claim:

1. A shifter for N-NARY logic, comprising:
    an input configured to receive an input numerical value represented as a first plurality of N-NARY 1 of N signals where N is greater than 2, each of the N-NARY 1 of N signals being implemented on a set of physical wires;
    an output configured to provide an output numerical value represented as a second plurality of N-NARY 1 of N signals where N is greater than 2, each of the N-NARY 1 of N signals being implemented on a set of physical wires;
    a shift amount input that receives a shift amount and that determines the relationship of the output with respect to the input; and
    a circuit configured to receive the input and to provide the output upon receiving the input, the output having a relationship with respect to the input defined by a shift operation wherein no one-to-one correspondence exists between the wires of the input and the wires of the output.

2. The shifter of claim 1 wherein the shift amount input is a value unequal to any integer multiple of the number $\log_2 N$ where N represents the number of physical wires implementing each of the input N-NARY signals.

3. The shifter of claim 1 wherein the shift amount input is a value less than any integer multiple of the number $\log_2 N$, where N represents the number of physical wires implementing each of the input N-NARY signals.

4. A system that uses a shifter for N-NARY logic, comprising:
    an input configured to receive an input numerical value represented as a first plurality of N-NARY 1 of N signals where N is greater than 2, each of the N-NARY 1 of N signals being implemented on a set of physical wires;
    an output configured to provide an output numerical value represented as a second plurality of N-NARY 1 of N signals where N is greater than 2, each of the N-NARY 1 of N signals being implemented on a set of physical wires;
    a shift amount input that receives a shift amount and that determines the relationship of the output with respect to the input; and
    a circuit configured to receive the input and to provide the output upon receiving the input, the output having a relationship with respect to the input defined by a shift operation wherein no one-to-one correspondence exists between the wires of the input and the wires of the output.

5. The system of claim 4 wherein the shift amount input is a value unequal to any integer multiple of the number $\log_2 N$ where N represents the number of physical wires implementing each of the input N-NARY signals.

6. The system of claim 4 wherein the shift amount input is a value less than any integer multiple of the number $\log_2 N$, where N represents the number of physical wires implementing each of the input N-NARY signals.

7. A method to make a shifter for N-NARY logic, comprising:

providing an input configured to receive an input numerical value represented as a first plurality of N-NARY 1 of N signals where N is greater than 2, each of the N-NARY 1 of N signals being implemented on a set of physical wires;

providing an output configured to provide an output numerical value represented as a second plurality of N-NARY 1 of N signals where N is greater than 2, each of the N-NARY 1 of N signals being implemented on a set of physical wires;

providing a shift amount input that receives a shift amount and that determines the relationship of the output with respect to the input; and coupling a circuit to said input and to said output, said circuit configured to receive the input and to provide the output upon receiving the input with the output having a relationship with respect to the input defined by a shift operation wherein no one-to-one correspondence exists between the wires of the input and the wires of the output.

8. The method of claim 7 wherein the shift amount input is a value unequal to any integer multiple of the number $\log_2 N$ where N represents the number of physical wires implementing each of the input N-NARY signals.

9. The method of claim 7 wherein the shift amount input is a value less than any integer multiple of the number $\log_2 N$, where N represents the number of physical wires implementing each of the input N-NARY signals.

10. A method that uses a shifter for N-NARY logic, comprising:

receiving an input numerical value into an input wherein the input numerical value is represented as a first plurality of N-NARY 1 of N signals where N is greater than 2, each of the N-NARY 1 of N signals being implemented on a set of physical wires;

configuring a circuit to receive the input and to provide an output upon receiving the input, the output having a relationship with respect to the input defined by a shift operation wherein no one-to-one correspondence exists between the wires of the input and the wires of the output;

providing a shift amount input that receives a shift amount and that determines the relationship of the output with respect to the input; and providing an output to provide an output numerical value represented as a second plurality of N-NARY 1 of N signals where N is greater than 2, each of the N-NARY 1 of N signals being implemented on a set of physical wires.

11. The method of claim 10 wherein the shift amount input is a value unequal to any integer multiple of the number $\log_2 N$ where N represents the number of physical wires implementing each of the input N-NARY signals.

12. The method of claim 10 wherein the shift amount input is a value less than any integer multiple of the number $\log_2 N$, where N represents the number of physical wires implementing each of the input N-NARY signals.

* * * * *